US012391033B2

(12) United States Patent
Huang et al.

(10) Patent No.: US 12,391,033 B2
(45) Date of Patent: Aug. 19, 2025

(54) LAMINATION PROCESS, AND MANUFACTURING METHOD OF SEMICONDUCTOR PACKAGE USING A CHUCK

(71) Applicant: Taiwan Semiconductor Manufacturing Company, Ltd., Hsinchu (TW)

(72) Inventors: Wei-Jie Huang, Hsinchu (TW); Yu-Ching Lo, Hsinchu (TW); Ching-Pin Yuan, Hsinchu (TW); Wen-Chih Lin, Hsinchu (TW); Cheng-Yu Kuo, Kaohsiung (TW); Yi-Yang Lei, Taichung (TW); Ching-Hua Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/363,750

(22) Filed: Aug. 2, 2023

(65) Prior Publication Data
US 2024/0017538 A1    Jan. 18, 2024

Related U.S. Application Data

(62) Division of application No. 17/395,440, filed on Aug. 5, 2021, now Pat. No. 11,993,066.

(60) Provisional application No. 63/168,274, filed on Mar. 31, 2021.

(51) Int. Cl.
*H01L 21/48* (2006.01)
*B32B 38/18* (2006.01)
*H01L 23/00* (2006.01)

(52) U.S. Cl.
CPC ...... *B32B 38/1858* (2013.01); *H01L 21/4857* (2013.01); *H01L 24/96* (2013.01)

(58) Field of Classification Search
CPC ............ B32B 38/1858; B32B 37/0046; B32B 38/1825; H01L 21/6838; H01L 21/67121; H01L 21/02104–02697
See application file for complete search history.

(56) References Cited

U.S. PATENT DOCUMENTS

| 2012/0168940 A1* | 7/2012 | Bieck ................ H01L 21/76898 |
| | | 438/758 |
| 2022/0093580 A1* | 3/2022 | Tsai ........................ H01L 24/96 |
| 2023/0178509 A1* | 6/2023 | Jun ........................ B41M 5/382 |
| | | 438/119 |

FOREIGN PATENT DOCUMENTS

| CN | 105405805 A | * | 3/2016 | ............. H01L 21/02 |
| JP | 2014143295 A | * | 8/2014 | |
| KR | 20190065726 A | * | 6/2019 | ....... H01L 21/67092 |
| WO | WO-2015020445 A1 | * | 2/2015 | ......... G02B 6/02033 |
| WO | WO-2015040915 A1 | * | 3/2015 | ....... H01L 21/67748 |

* cited by examiner

*Primary Examiner* — Evan G Clinton
(74) *Attorney, Agent, or Firm* — JCIPRNET

(57) ABSTRACT

A lamination chuck for lamination of film materials includes a support layer and a top layer. The top layer is disposed on the support layer. The top layer includes a polymeric material having a Shore A hardness lower than a Shore hardness of a material of the support layer. The top layer and the support layer have at least one vacuum channel formed therethrough, vertically extending from a top surface of the top layer to a bottom surface of the support layer.

20 Claims, 24 Drawing Sheets

LAMINATION PROCESS, AND MANUFACTURING METHOD OF SEMICONDUCTOR PACKAGE USING A CHUCK

CROSS-REFERENCE TO RELATED APPLICATION

This application is a divisional application of and claims the priority benefit of a prior application Ser. No. 17/395,440, filed on Aug. 5, 2021, now pending. The prior application Ser. No. 17/395,440 claims the priority benefit of U.S. provisional application Ser. No. 63/168,274, filed on Mar. 31, 2021. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed, and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
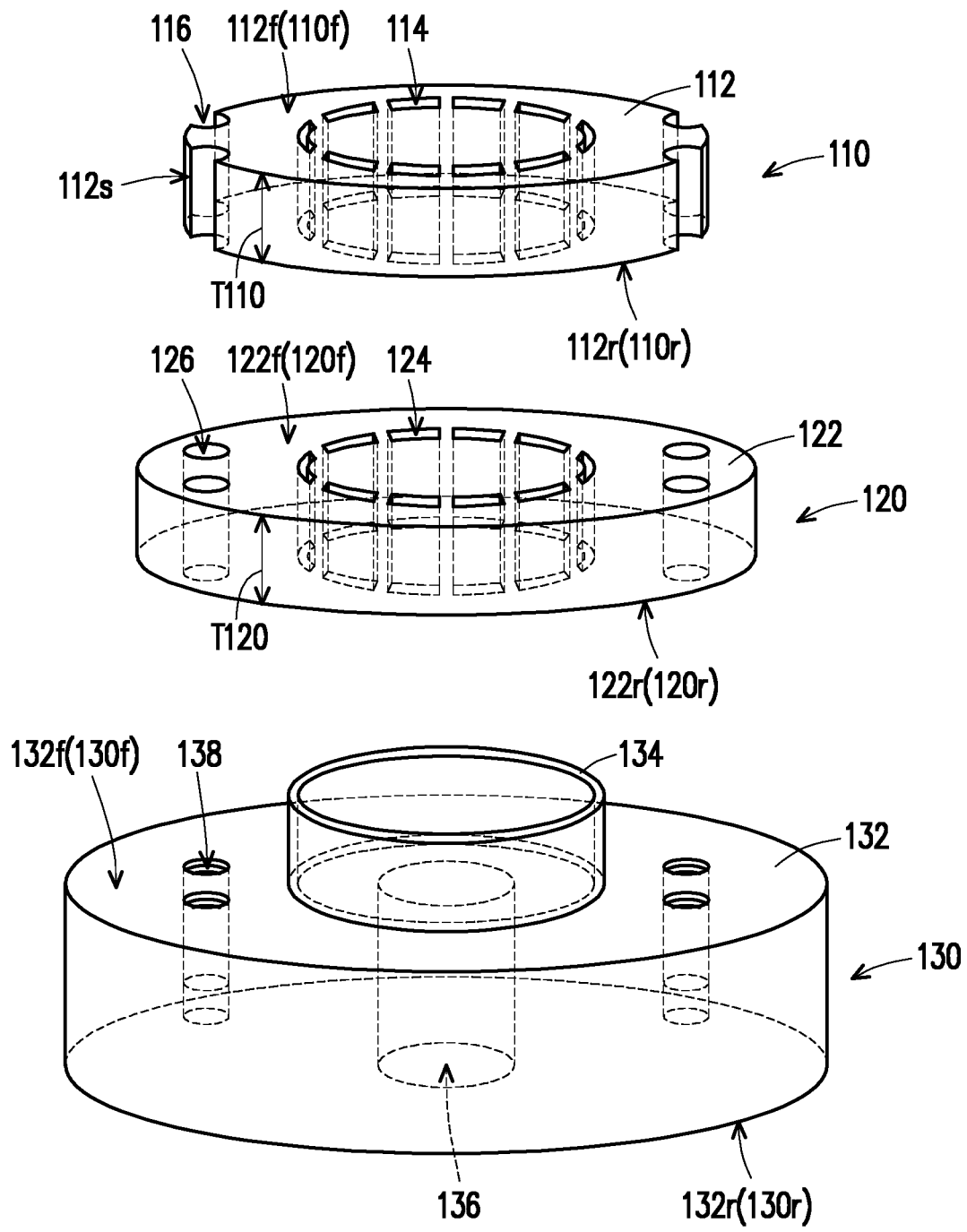
FIG. 1A is a schematic exploded view of a lamination chuck according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
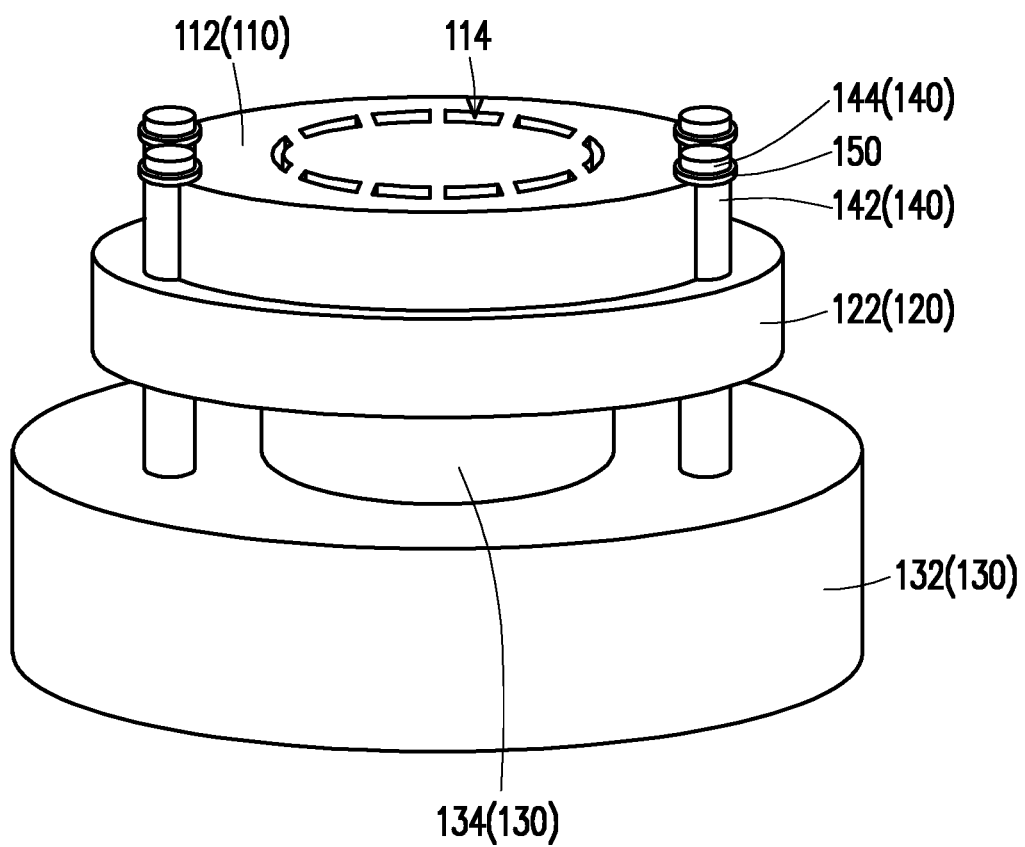
FIG. 1B is a schematic perspective view of a lamination chuck according to some embodiments of the present disclosure.
Figure 2A:
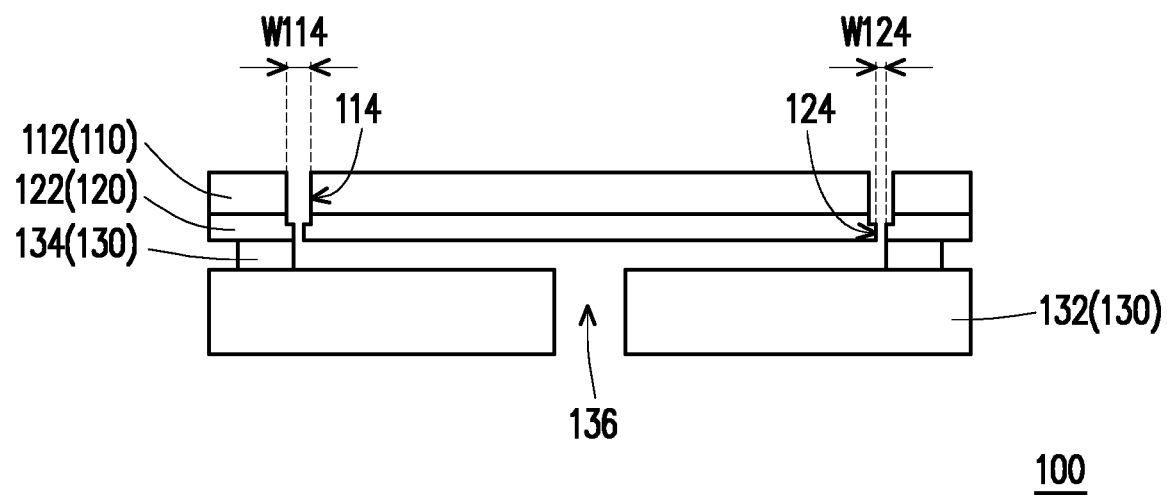
FIG. 2A is a schematic cross-sectional view of a lamination chuck according to some embodiments of the present disclosure.
Figure 2B:
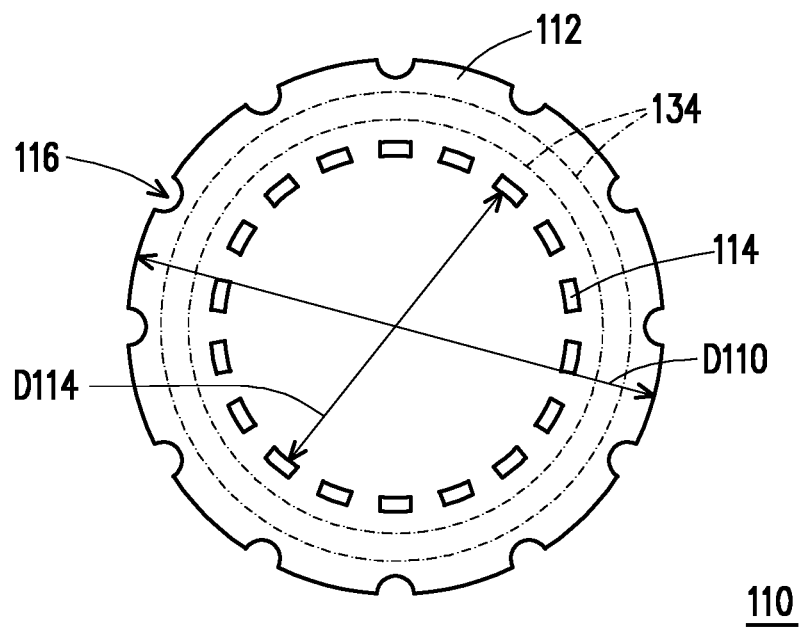
FIG. 2B is a schematic top view of a top layer of a lamination chuck according to some embodiments of the present disclosure.

FIG. 1A is a schematic exploded view of a lamination chuck 100 according to some embodiments of the disclosure. FIG. 1B is a schematic perspective view of the lamination chuck 100 according to some embodiments of the disclosure. FIG. 2A is a schematic cross-sectional view of the lamination chuck 100 according to some embodiments of the disclosure. FIG. 2B is a schematic cross-sectional view of a top layer 110 of the lamination chuck 100 according to some embodiments of the disclosure. Referring to FIG. 1A to FIG. 2B, the top layer 110 may have a body 112 including (or made of) a soft and elastic material, such as a polymeric material. In some embodiments, the polymeric material includes a rubber with Shore A hardness in the range from 20 to 50. In some embodiments, the polymeric material includes powder-free sponge, such as carbon powder free sponge (compatible with clean room class 100 regulation whereas substantially zero particle number for the particle size larger than 5 microns) with Shore A hardness in the range from 10 to 20 and being a porous material having tiny close pores of about or less than 10 microns. In some embodiments, the top layer 110 includes one or more vacuum channels 114, extending through the body 112 from one side to the opposite side of the body 112 along a thickness direction of the body 112. The vacuum channels 114 may extend completely through the body 112, in a direction perpendicular to the front surface 112f and the opposite rear surface 112r of the body 112, thus creating fluidic communication between opposite sides of the body 112. A side surface 112s of the body 112 joints the front surface 112*f* (the front surface 110*f* of the top layer 110) to the opposite rear surface 112*r* (the rear surface 110*r* of the top layer 110). The side surface 112*s* may be considered an outer edge of the top layer 110. In some embodiments, the body 112 may have a cylindrical shape, for example with a height (e.g., a thickness T110 of the body 112) in the range from 400 micrometers to about 3 millimeters. However, the shape of the body 112 (and of the lamination chuck 100) is not particularly limited, and, while in the drawings the lamination chuck 100 and the top layer 110 are shown as cylindrical, with circular outlines, other shapes (e.g., elliptical, polygonal—rectangular, square, pentagonal, hexagonal, heptagonal, octagonal, etc.) are also contemplated within the scope of the disclosure, for example depending on the shape of the substrate to be processed.

In some embodiments, the vacuum channel(s) 114 may have an outline substantially parallel to a section of the side surface 112*s* of the body 112. For example, when the body 112 has a cylindrical shape, the vacuum channel(s) may be formed in an annular arc shape, at a certain distance from the side surface 112*s* of the body 112. In some embodiments, a plurality of vacuum channels 114 is formed in the top layer 110, extending at a (in some cases, regular) distance from each other along the periphery of the top layer 110, with ends opening at the front surface 112*f* of the body and at the opposite rear surface 112*r* of the body. For example, for a cylindrical body 112 such as the one of FIG. 1 and FIG. 2B, the vacuum channels 114 may be formed as arcs of an annular region of inner diameter D114 smaller than the diameter D110 of the top layer 110, where the annular region of inner diameter D114 and the circumference of the body 112 of diameter D110 are concentric. For example, the ratio of the inner diameter D114 of the annular region of the vacuum channels 114 to the diameter D110 of the top layer 110 may be about in the range from 0.98 to 0.99. By way of example and not of limitation, when the diameter D110 of the top layer 110 is about 300 mm, the inner diameter D114 of the annular region where the vacuum channels 114 are formed may be in the range from 295 to 297 mm. In some embodiments, the width W114 of the vacuum channels 114 (measured in a radial direction for annular shapes, and perpendicular to the edges for frame shapes) may be up to about 1 mm, for example up to about 800 micrometers. While specific shapes and geometries have been described above for the vacuum channels 114, the disclosure is not limited thereto. For example, the region in which the vacuum channels 114 are formed is not limited to be an annular region, and, in some alternative embodiments, may be shaped as a frame of different outlines (e.g., elliptical, polygonal—square, rectangular, pentagonal, hexagonal, octagonal, etc.). Similar relationships to the one described above may exist between characteristic dimensions of the other shapes when the top layer 110 and/or the region of the vacuum channels 114 are formed in other shapes. For example, the top layer 110 may be rectangular or square, and the region of the vacuum channel 114 may be a concentric rectangular or square frame region, with the ratio of the respective diagonals in the range indicated above. In some embodiments, combinations of different shapes are also possible (e.g., a square top layer 110 and a concentric annular region for the vacuum channels 114), with the ratio of the characteristic dimensions of the shapes being in the above range (e.g., the ratio of the inner diameter D114 of the annual region to a diagonal of the square, etc.).

In some embodiments, the top layer 110 is disposed on a support layer 120. The support layer 120 may have a body 122 including (or made of) a rigid material. That is, the material of the body 122 may be harder than the material of the body 112. For example, the body 122 may include (or be made of) a hard metal or alloys, such as stainless steel or aluminum alloys with Rockwell B-type hardness of about 70-90. In some embodiments, the body 122 of the support layer 120 is larger than the body 112 of the top layer 110, so that when the body 112 is disposed on the body 122, the body 122 laterally protrudes with respect to the body 112. In some embodiments, the body 112 of the top layer 110 is bonded to body 122 of the support layer 120, for example by thermal pressing. The body 122 may present similar features to the body 112. For example, the body 112 and the body 122 may have similar shapes, so that if the body 112 is cylindrical, also the body 122 is cylindrical. However, the disclosure is not limited thereto, and other combinations of shapes (e.g., a cylindrical body 112 on a parallelepiped body 122, etc.) are possible and contemplated in the disclosure. In some embodiments, the thickness T120 of the support layer 120 may be about in the range from 3 mm to 7 mm, for example about 5 mm.

In some embodiments, one or more vacuum channels 124 are formed extending from one side to an opposite side of the body 122 along a thickness direction of the body 122, that is, extending from the front surface 122*f* of the body 122 (the front surface 120*f* of the support layer 120) up to the opposite rear surface 122*r* (the rear surface 120*r* of the support layer 120). The one or more vacuum channels 124 are formed in positions corresponding to the one or more vacuum channels 114 of the top layer 110. As such, when the top layer 110 is disposed on the support layer 120, the vacuum channels 114 of the top layer 110 are aligned with the vacuum channels 124 of the support layer 120, thus forming combined vacuum channels (114+124) extending from the front surface 112*f* of the top layer 112 to the rear surface 122*r* of the support layer 120. In some embodiments, the vacuum channels 124 may be formed of similar shape to the vacuum channels 114. For example, in the lamination chuck 100 of FIG. 1 both the vacuum channels 114 and the vacuum channels 124 have the outlines of annular arcs. In some embodiments, the vacuum channels 124 may have substantially the same sizes as those of the vacuum channels 114. In some embodiments, the vacuum channels 124 may be narrower than the vacuum channels 114, so that the width W124 of the vacuum channels 124 (measured along the same radial direction as the width W114) may be smaller than the width W114 of the vacuum channels 114. That is, proceeding from the front surface 110*f* of the top layer 110 towards the rear surface 120*r* of the support layer 120, the combined vacuum channels (114+124) may become increasingly narrow. In some embodiments, the upper part of the vacuum channel(s) 124 have the same width W114 as the overlying vacuum channel(s) 114, and the lower part of the vacuum channel(s) 124 have the narrower width W124. That is, the constriction of the combined vacuum channel(s) (114+124) may be located along the vacuum channel(s) 124 of the support layer 120.

In some embodiments, the top layer 110 and the support layer 120 may be disposed on a base 130. The base 130 includes a body 132 on which the support layer 120 and the top layer 110 are disposed. In some embodiments, the base 130 includes an insulation wall 134 protruding from a front surface 132*f* of the body 132 (a front surface 130*f* of the base 130), and, when assembled, the support layer 120 rests on the insulation wall 134. As illustrated by the footprint of the insulation wall 134 illustrated in FIG. 2B with dash-dotted lines, an inner dimension of the insulation wall 134 may be sufficiently large so that the insulation wall 134 encircles the vacuum channels 114, 124 when the support layer 120 and the top layer 110 are disposed on the base 130. That is, the vacuum channels 124 open to an area encircled by the insulation walls 134. In some embodiments, the insulation wall 134 has a similar shape as the region in which the vacuum channels 114, 124 are formed. For example, when the vacuum channels 114, 124 are formed as annular arcs of an annular region, the insulation wall 134 may have an annular shape with an inner diameter larger than the outer diameter of the annular region in which the vacuum channels 114, 124 are formed. However, as for the region where the vacuum channels 114, 124 are formed, also the shape of the insulation wall 134 is not limited by the disclosure. In some alternative embodiments, the insulation wall 134 may form frames of different outline (e.g., elliptical, polygonal-rectangular, square, pentagonal, hexagonal, heptagonal, octagonal, etc.). In some embodiments, the rear surface 120r of the support layer 120 may be substantially flat (e.g., as shown in FIG. 1A) so that the support layer 120 rests on the insulation wall 134, and is separated from the front surface 132r of the body 132 by a distance corresponding to the thickness of the insulation wall 134.

In some embodiments, one or more through holes 136 are formed in the region of the base 130 encircled by the insulation wall 134. For example, a through hole 136 is illustrated in FIG. 1A as vertically extending in the central region of the base 130 from the rear surface 132r of the body 132 to the front surface 132f of the body 132, with the end at the side of the front surface 132f being surrounded by the insulation wall 134. In some embodiments, the insulation wall 134 acts as a spacer between the body 132 of the base and the support layer 120, so that a gap remains between the rear surface 120r of the support layer 120 and the front surface 132f of the body 132. Therefore, even though the through hole 136 of the base 130 is vertically misaligned with respect to the vacuum channels 124, 114, such vacuum channels 114, 124 are still connected to the through hole 136, so that fluidic communication is established between the rear surface 130r of the base 130 and the front surface 110f of the top layer 110. That is, the when the top layer 110 and the support layer 120 are disposed on the base 130, the combined vacuum channels (114+124) may be considered branches of a channel extending from the end of the through hole 136 at the rear surface 130r of the base to the ends of the vacuum channels 114 at the front surface 110f of the top layer 110. In some embodiments, by connecting a vacuum pump to the through hole 136 of the base 130, a suction applied to the through hole 136 is transmitted to the vacuum channels 114, 124. In some embodiments, the insulation wall 134 contacts the support layer 120, whereby the suction applied to the through hole 136 of the base 130 is also applied to the vacuum channels 114, 124. In some embodiments, connecting structures (not shown) may be formed at the rear side 130r of the base 130, to connect the lamination chuck 100 to the vacuum pump and/or any other machine which may be needed when operating the lamination chuck 100. For example, the lamination chuck 100 may be additionally connected to servo motors enabling movement (e.g., vertical movement) of the lamination chuck 100 during operation.

In some embodiments, the top layer 110 and the support layer 120 may be secured to the base 130 via fasteners 140, such as screws, bolts or the like or the like. For example, the support layer 120 may have formed therethrough one or more through holes 126, in which fasteners 140 are disposed to be tightened into holes 138 formed in the base 130. One or both of the through holes 126 of the support layer 120 and the holes 138 of the base 130 may be threaded. In some embodiments, the holes 138 of the base 130 may be blind holes. In some embodiments, fastening semi-holes 116 are formed along the side surface 112s of the body 112. The fastening semi-holes 116 may be hemicylindrical concavities formed at intervals from each other along the side surface 112s of the body 112, and, as the vacuum channels 114, may extend from the front surface 112f of the body 112 to the rear surface 112r of the body 112, for the entire thickness T110 of the top layer 110. In some embodiments, when the lamination chuck 100 is assembled, the fastening semi-holes 116 are vertically aligned with the through holes 126 of the support layer 120 and the holes 138 of the base 130. For example, when screws are used as the fasteners 140, the body 142 of the screws may be at least partially accommodated in the fastening semi-holes 116, and further pass through the through holes 126 to be received in the holes 138. The heads 144 of the screws may at least partially overlap with the front surface 110f of the top layer 110. In some embodiments, washers 150 may be inserted between the heads 144 of the screws and the front surface 110f of the top layer 110, to increase the contact area in which the fastening force of the screws is exercised. In FIG. 1A and FIG. 1B only a few fastening semi-holes 116, through holes 126, holes 138, and fasteners 140 are illustrated for clarity purpose, but it should be noted that the fastening semi-holes 116 (with associated through holes 126 and holes 138) may be formed in several positions all along the side surface 112s of the body 112, for example as illustrated in FIG. 2B, and that the disclosure is not limited by the number of fasteners 140 used to assemble the lamination chuck 100.

Figure 3A:
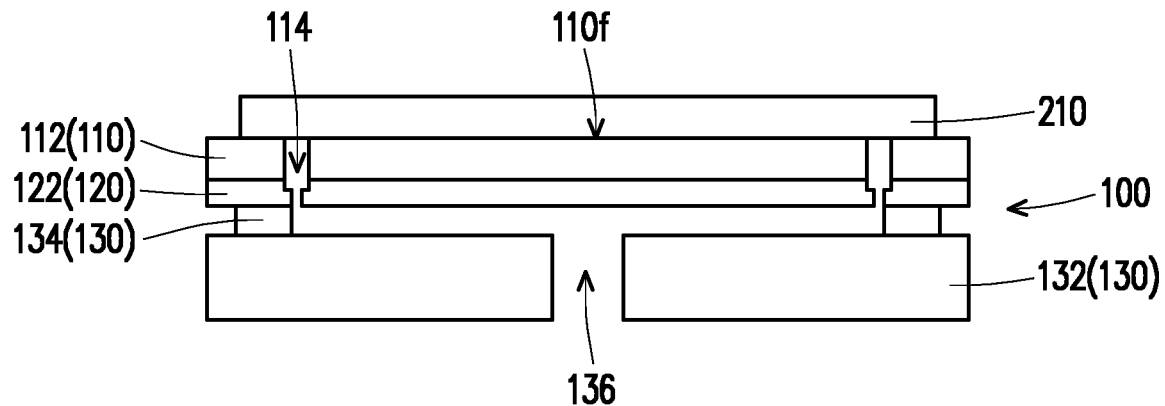
FIG. 3A to FIG. 3C are schematic cross-sectional views of structures formed during a lamination process according to some embodiments of the present disclosure.
Figure 3B:
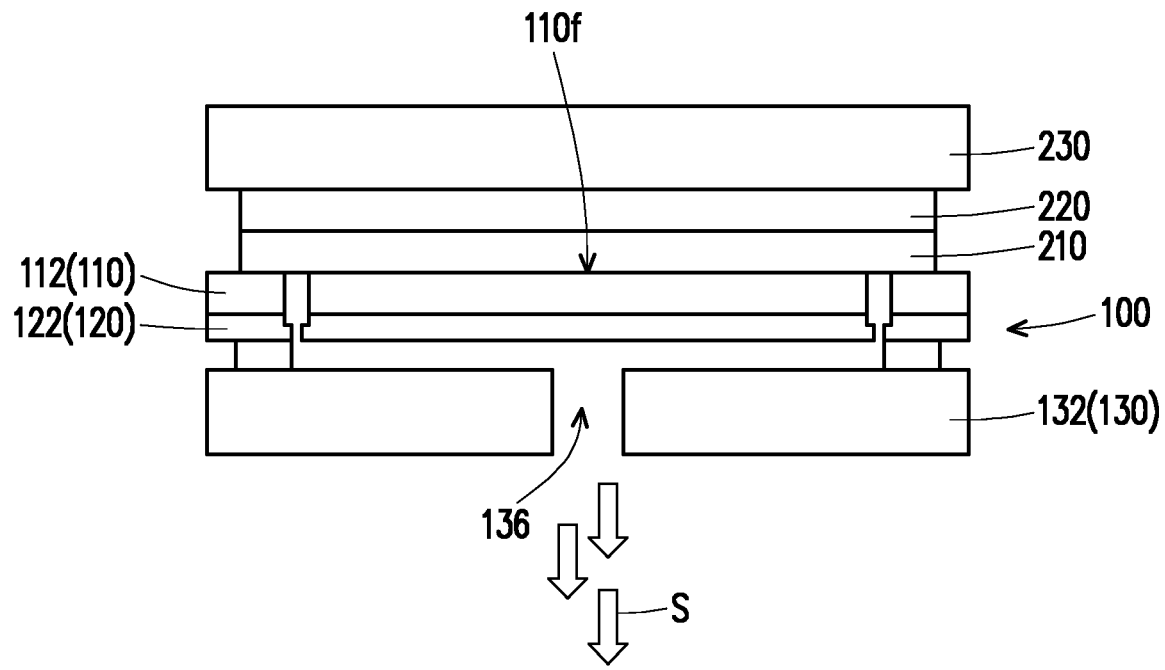
Figure 3C:
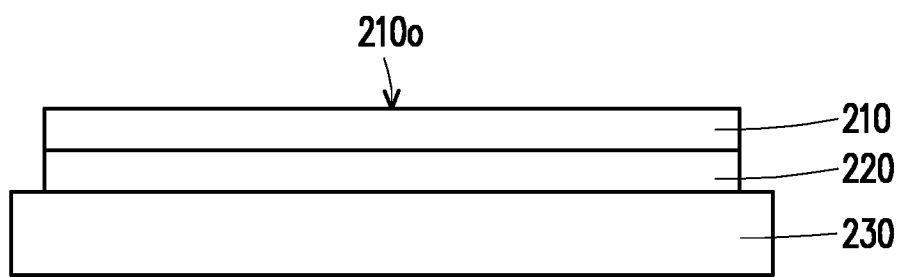

FIG. 3A to FIG. 3C are schematic cross-sectional views of structures formed during a lamination process in which the lamination chuck 100 is used according to some embodiments of the disclosure. In some embodiments, the lamination chuck 100 may be used for laminating a film material 210 on a lamination substrate 220. For example, the film material 210 may be disposed on the lamination chuck 110, and the lamination chuck 110 with the film material 210 disposed thereon may then be brought into contact with the lamination substrate 220. Upon application of pressure and/or heating, the film material 210 may be laminated on the lamination substrate 220. In FIG. 3A, a film material 210 to be laminated is disposed on the front surface 110f of the top layer 110 of the lamination chuck 100. In some embodiments, the film material 210 is disposed so as to cover the vacuum channels 114 of the top layer 110. In some embodiments, disposing the film material 210 on the front surface 110f of the top layer 110 may include performing a preliminary alignment step, so that the film material 210 is ready to be laminated at a desired position of a lamination substrate 220 (illustrated, e.g., in FIG. 3B). In some embodiments, the film material 210 may be pre-cut, and one or more transfer operations may be performed to ensure correct alignment of the film material 210 with the lamination substrate 220.

In FIG. 3B, the film material 210 is contacted with the lamination substrate 220. In some embodiments, the lamination substrate 220 may be disposed on a carrier 230, which may be a temporary carrier such as a frame or the like, or may be part of the desired product structure together with the lamination substrate 220. In some embodiment, before the film material 210 on the lamination chuck 100 is brought into contact with the lamination substrate 220, suction S may be applied to the through hole 136 of the base 130, for example by activation of a vacuum pump (not shown), and the suction S may be transmitted to the film material 210 in correspondence of the vacuum channels 114 of the lamination chuck 110. In some embodiments, the applied suction S may be such to generate a pressure differential with respect to atmospheric pressure, so that the film material 210 is tense on the front surface 110f of the top layer 110. In some embodiments, by including a soft material in the top layer 110, tearing of the film material 210 upon application of the suction S may be avoided or reduced. The magnitude of the pressure differential may be regulated according to the nature of the film material 210. In some embodiments, the suction S may be such to generate a pressure differential of about 60 kPa to 80 kPa with respect to atmospheric pressure. In some embodiments, after the suction S has been applied, the lamination chuck 100 with the film material 210 disposed thereon are contacted (e.g., pressed) against the lamination substrate 220, and heat may be applied as required. The contact force between the lamination substrate 220 and the film material 210 and the temperature if heating is applied may be set depending on the materials to be laminated. In some embodiments, the contact force may be such to result in a pressure of about 1 Kg/cm$^2$ to about 5 Kg/cm$^2$, and the temperature may be in a range from about 70° C. to about 130° C.

Referring to FIG. 3B and FIG. 3C, after the film material 210 is laminated to the lamination substrate 220, the film material 210 may be separated from the lamination chuck 100, while remaining on the lamination substrate 220. In some embodiments, by laminating the film material 210 to the lamination substrate 220 with a lamination chuck 110 of the disclosure, a smooth outer surface 210o of the laminated film material 210 on the lamination substrate 220 may be obtained. The outer surface 210o of the laminated film material 210 may correspond to the surface contacting the top layer 110 of the lamination chuck 100. For example, indentation and irregularities of the film material 210 laminated on the lamination substrate 220 may be smaller than about 50 micrometers.

In some embodiments, the type of film material 210 to be laminated is not particularly limited. For example, the lamination chuck 100 may be used in vacuum lamination processes of various types of film materials 210 as encountered in semiconductor manufacturing, such as dielectric films (e.g., back-side dielectric layers, dielectric layers of redistribution structures, solder resist, etc.), adhesive films (e.g., die-attach films), or the like. As a non-limiting example, in FIG. 4A to Figure are illustrated schematic cross-sectional views of structures formed during a manufacturing process of a semiconductor package SP10 according to some embodiments of the disclosure.

Figure 4A:
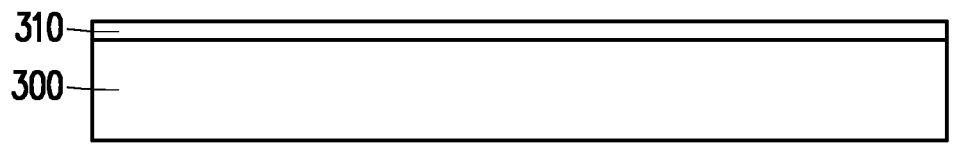
FIG. 4A to FIG. 4M are schematic cross-sectional view of structures formed during a manufacturing process of a semiconductor package according to some embodiments of the present disclosure.

In FIG. 4A, a carrier 300 having a de-bonding layer 310 formed thereon is provided. In some embodiments, the carrier 300 is a glass substrate, a metal plate, a plastic supporting board or the like, but other suitable substrate materials may be used as long as the materials are able to withstand the subsequent steps of the process. In some embodiments, the de-bonding layer 310 includes a light-to-heat conversion (LTHC) release layer, which facilitates peeling the carrier 300 away when required by the manufacturing process.

Figure 4B:
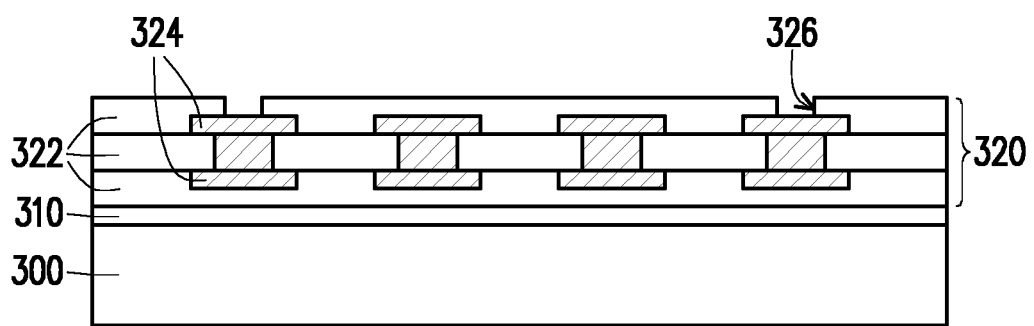

In FIG. 4B, a redistribution structure 320 is formed over the carrier 300, for example on the de-bonding layer 310. In some embodiments, the redistribution structure 320 includes dielectric layers 322 and redistribution conductive layers 324 alternately stacked. The redistribution conductive layers 324 extend horizontally in between consecutively stacked dielectric layers 322 and vertically through openings of the underlying dielectric layers 322 to establish electrical connection with the underlying redistribution conductive layers 324. In some embodiments, the outermost dielectric layer 322 (e.g., the dielectric layer 322 closer to the carrier 300), may be not patterned, so that the outermost redistribution conductive layer 324 is fully separated from the carrier 300 (or the de-bonding layer 310). In some embodiments, the innermost dielectric layer 322 (e.g., the dielectric layer 322 further from the carrier 300) includes openings 326 exposing sections of the innermost redistribution conductive layer 324.

In some embodiments, the dielectric layers 322 may, independently from each other, include polyimide, epoxy resin, acrylic resin, phenol resin, benzocyclobutene (BCB), polybenzooxazole (PBO), or any other suitable polymer-based dielectric material. The dielectric layers 322 may be formed by suitable fabrication techniques such as spin-on coating, chemical vapor deposition (CVD), plasma-enhanced chemical vapor deposition (PECVD), or the like. In some embodiments, the redistribution conductive layers 324 may independently include aluminum, titanium, copper, nickel, tungsten, and/or alloys thereof, for example. The redistribution conductive layers 324 may be formed by electroplating, deposition, and/or photolithography and etching. It should be noted that the number of redistribution conductive layers 324 and dielectric layers 322 illustrated in FIG. 4B is merely for illustrative purposes, and the disclosure is not limited thereto. In some alternative embodiments, more or fewer redistribution conductive layers 324 and dielectric layers 322 may be formed depending on the circuit design.

In some embodiments, the carrier 300 is a wafer-size carrier, and the redistribution structure 320 is formed all over the carrier 300, so that the manufacturing process may be performed at a reconstructed wafer level. That is, a plurality of semiconductor packages may be manufactured simultaneously on the carrier 300, as a plurality of package units corresponding to different regions of the reconstructed wafer. For example, the redistribution structure 320 may be formed so as to match in size and span the carrier 300. While in FIG. 4A to FIG. 4L one of such package units is illustrated, the disclosure does not limit the number of package units simultaneously formed on the carrier 300. In some alternative embodiments, the semiconductor package being manufactured may be a wafer-size semiconductor package, so that the entire carrier 300 may be wafer-shaped and may correspond to a single package unit. In some embodiments, the semiconductor package being manufactured may be a panel-size semiconductor package, so that the carrier 300 may be panel-shaped and may correspond to a single package unit.

Figure 4C:
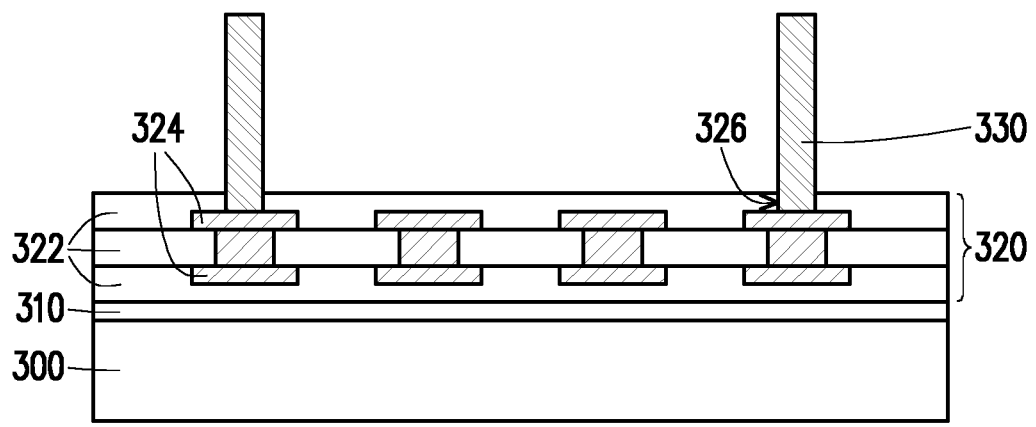

Referring to FIG. 4C, in some embodiments, through interlayer vias ("TIVs") 330 are formed on the redistribution structure 320 over the carrier 300. In some embodiments, the TIVs 330 are through integrated fan-out ("InFO") vias. In some embodiments, the TIVs 330 are formed by forming a mask pattern (not shown) having one or more openings in correspondence of the openings 326 of the redistribution structure 320, and forming a metallic material filling up the openings of the mask pattern to form the TIVs 330 by electroplating or deposition. In some embodiments, a seed layer (not shown) may be formed before the mask pattern to facilitate formation of the metallic material within the openings. It should be noted that whilst two TIVs 330 are illustrated in FIG. 4C, the disclosure does not limit the number of TIVs 330 to be included. In some alternative embodiments, fewer or more TIVs 330 may be formed.

Figure 4D:
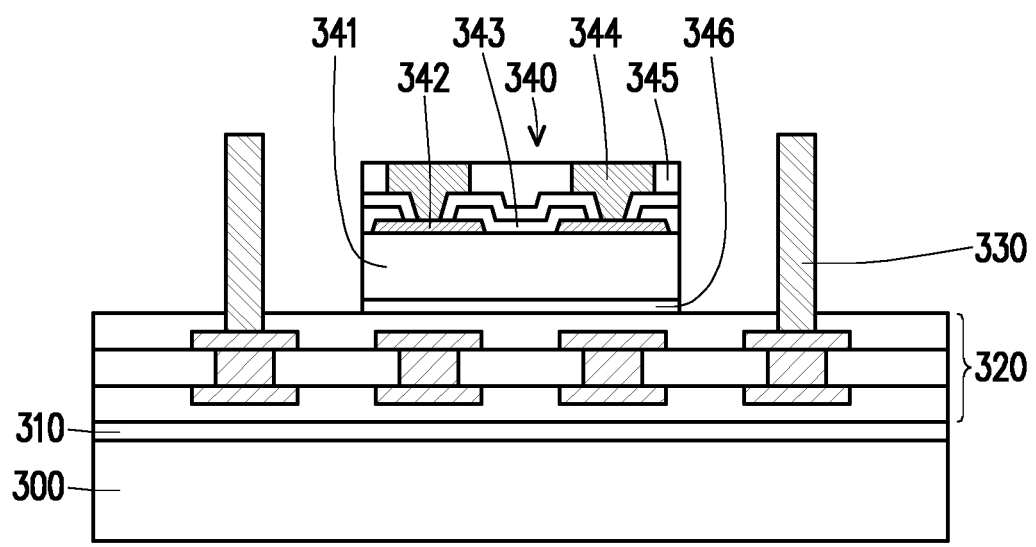
Figure 4E:
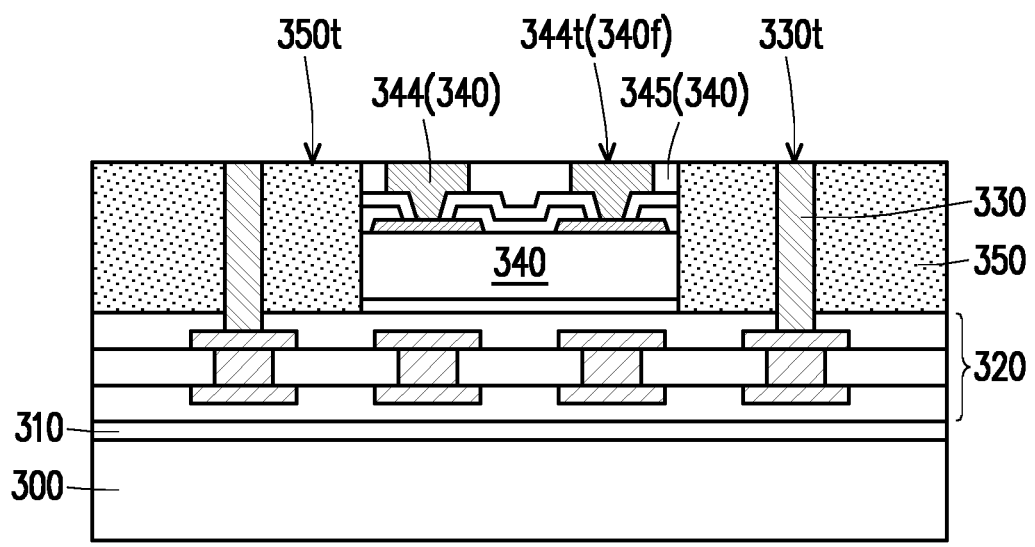

In some embodiments, referring to FIG. 4D, one or more semiconductor dies 340 are disposed on the redistribution structure 320 amongst the TIVs 330, for example by a pick-and-place method. In some embodiments, the semiconductor die 340 may include a semiconductor substrate 341 having active and/or passive devices formed therein, conductive pads 342 formed at the top surface of the semiconductor substrate 341, and a protective layer 343 formed on the top surface of the semiconductor substrate 341. Portions of the conductive pads 342 are exposed through openings of the protective layer 343. In some embodiments, the protective layer 343 may be a composite structure including stacked layers of one or more materials. In some embodiments, the semiconductor dies 340 may include metal posts 344 filling the openings of the protective layer 343 to contact the conductive pads 342, and a protective layer 345 disposed on the protective layer 313 and surrounding the metal posts 344. In some embodiments, the semiconductor die 340 is disposed with the semiconductor substrate 341 directed towards the redistribution structure 320 and the conductive pads 342 disposed away from the redistribution structure 320. In some embodiments, a die attach film 346 is disposed on the semiconductor substrate 341, to secure the semiconductor die 340 to the redistribution structure 320.

The structure illustrated in FIG. 4D for the semiconductor die 340 is merely an example, and other structures are contemplated within the scope of the disclosure. The semiconductor die 340 may be configured to perform any desired function. For example, the semiconductor die 340 may be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, the semiconductor die 340 includes a memory die such as a high bandwidth memory die. The disclosure is not limited by the type or number of semiconductor dies 340 included in a given package unit. For example, when multiple semiconductor dies 340 are included, the semiconductor dies 340 may be the same type of dies or perform the same functions. In some embodiments, the semiconductor dies 340 included in a same package unit may be different types of dies or perform different functions.

In some embodiments, an encapsulant 350 is formed on the redistribution structure 320 to laterally encapsulate the semiconductor die 340 and the TIVs 330. A material of the encapsulant 320 includes a molding compound, a polymeric material, such as polyimide, epoxy resin, acrylic resin, phenol resin, benzocyclobutene (BCB), polybenzoxazole (PBO), a combination thereof, or other suitable polymer-based dielectric materials. In some embodiments, the encapsulant is formed by a sequence of over-molding and planarization steps, whereby the material of the encapsulant 350 is removed until the metal posts 344 of the semiconductor die 340 and the top surfaces 330t of the TIVs 330 are exposed. In some embodiments, portions of the metal posts 344, the protective layer 345, and/or the TIVs 330 may also be removed during planarization of the encapsulant 350. Following planarization, the top surfaces 330t of the TIVs 330, and the front surface 340f of the semiconductor die 340 at which the metal posts 344 are exposed may be substantially coplanar with the top surface 350t of the encapsulant 350.

Figure 4F:
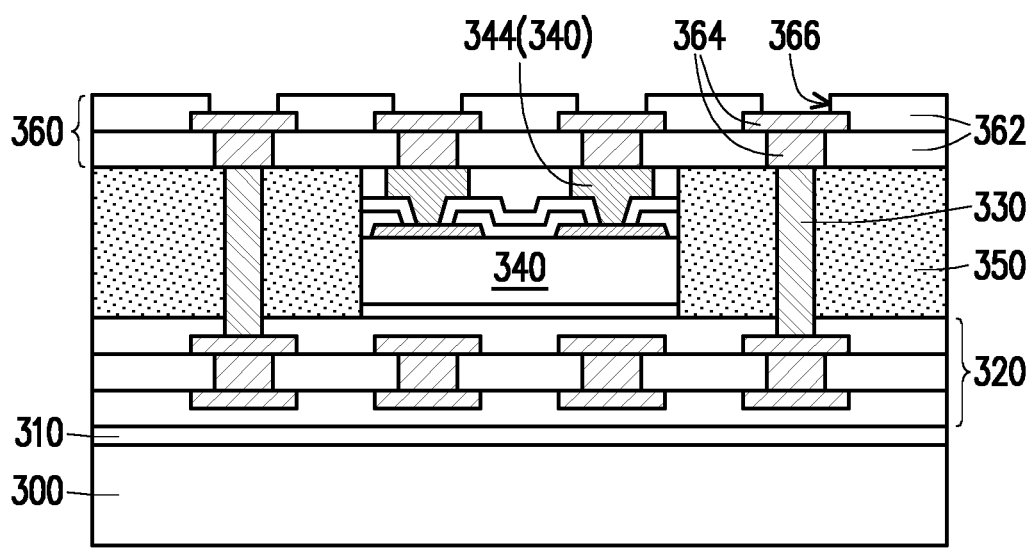

In FIG. 4F, according to some embodiments, a redistribution structure 360 is formed on the encapsulated semiconductor die 340 and the TIVs 330, with similar processes and materials as previously described for the redistribution structure 320. The redistribution structure 360 includes dielectric layers 362 and redistribution conductive layers 364 alternately stacked, in a number according to routing requirements. The innermost dielectric layer 362 (the dielectric layer 362 closer to the encapsulant 350) includes openings exposing at their bottom the TIVs 330 or the metal posts 344, so that the redistribution conductive layers 364 may establish electrical connection to the TIVs 330 and the semiconductor die 340. In some embodiments, the semiconductor die 340 may be electrically connected to the redistribution structure 320 via the redistribution structure 360 and the TIVs 330. The outermost dielectric layer 362 (the dielectric layer 362 further from the encapsulant 350) includes openings 366 exposing sections of the outermost redistribution conductive layer 364.

Figure 4G:
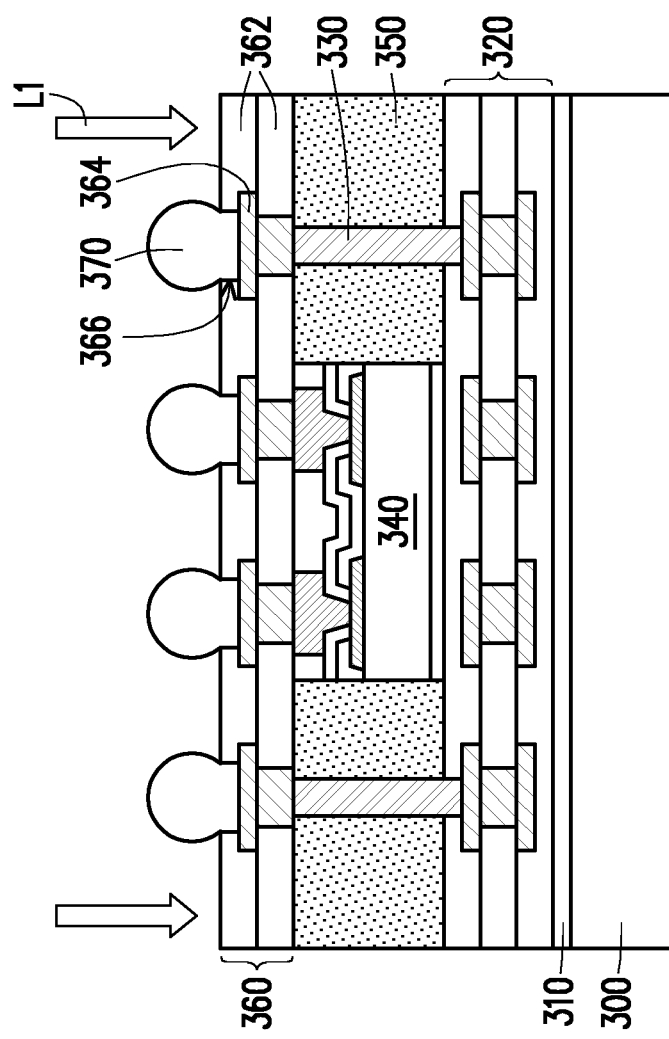

In some embodiments, as illustrated in FIG. 4G, connective terminals 370 are formed in the openings 366 of the redistribution structure 360 contacting the redistribution conductive layer 364, to allow electrical connection with external devices (not shown). In some embodiments, the connective terminals 370 may include C4-bumps, and, optionally, under-bump metallurgies formed in the openings 366. In some embodiments, a pre-cutting step may be optionally performed, for example after the connective terminals 370 have been formed. The pre-cutting step may include marking the exposed surface of the redistribution structure 360 where the connective terminals 370 have been formed in between adjacent package units. In some embodiments, the markings are formed by laser radiation L1 impinging on the redistribution structure 360 without cutting through the whole thickness of the reconstructed wafer.

Figure 4H:
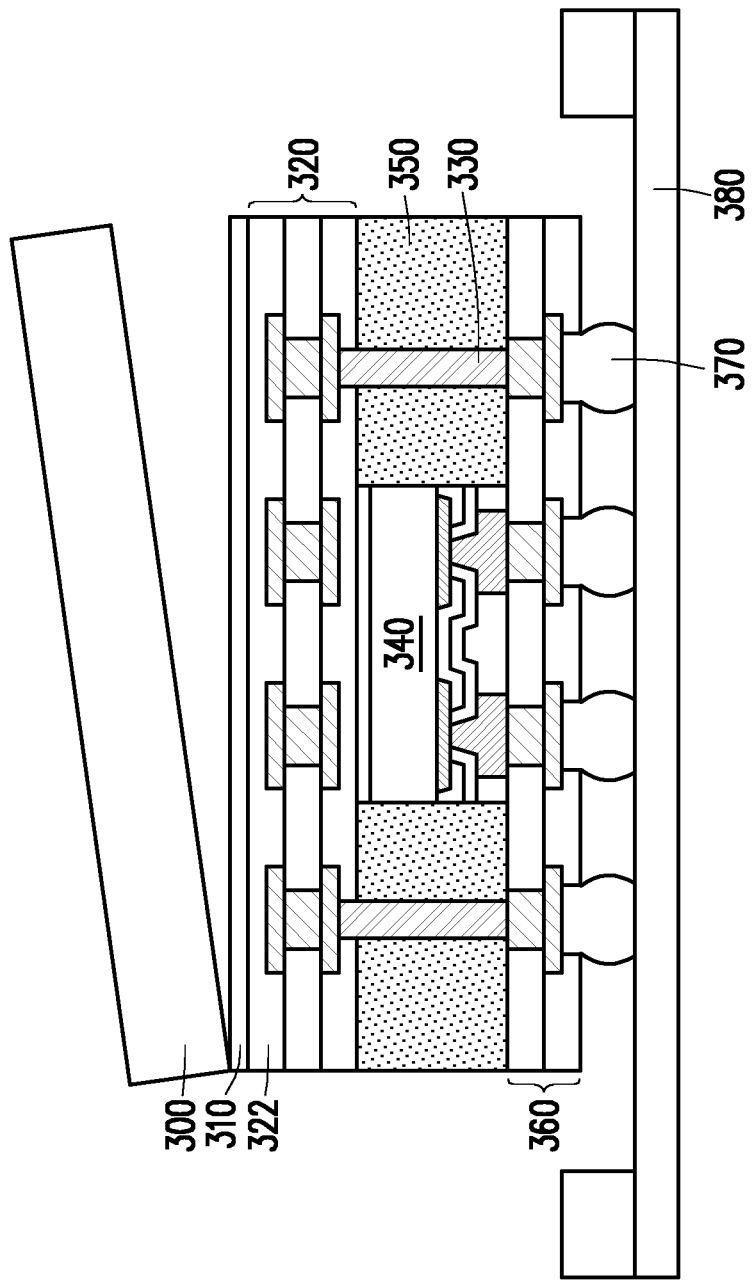

In FIG. 4H, the structure formed in FIG. 4G is flipped and mounted on a frame 380, with the connective terminals 370 directed towards the frame 380. In some embodiments, the connective terminals 370 may be embedded in protective tapes (not shown) to be mechanically protected during the subsequent steps of the manufacturing process. In some embodiments, the carrier 300 may be removed. For example, following irradiation of the de-bonding layer 310, the adhesion between the carrier 300 and the de-bonding layer 310 may be reduced, so that it may be possible to separate the carrier from the de-bonding layer.

Figure 4I:
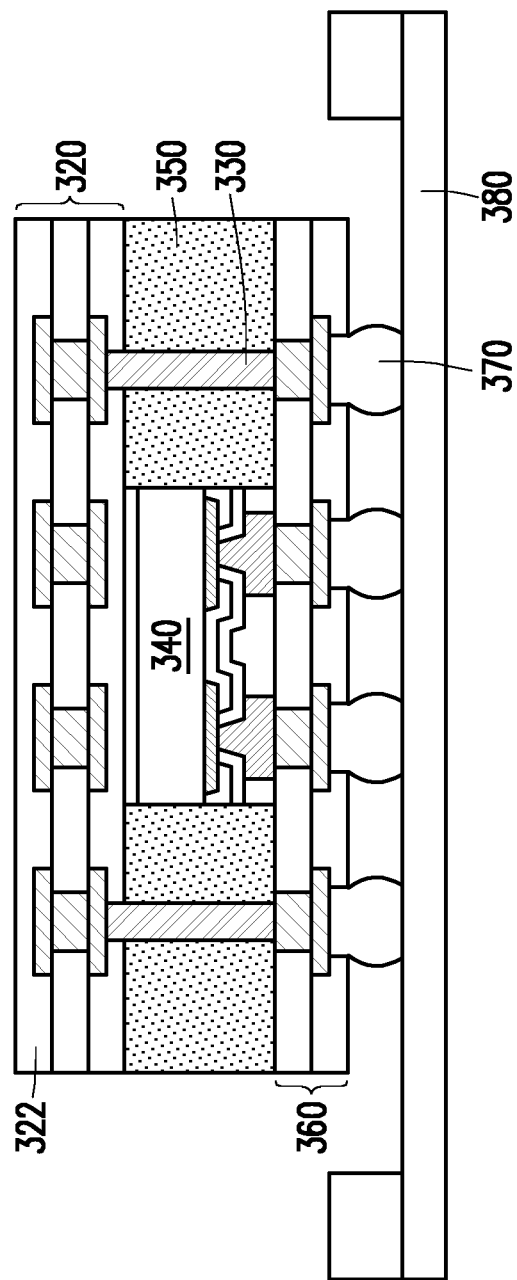
Figure 4J:
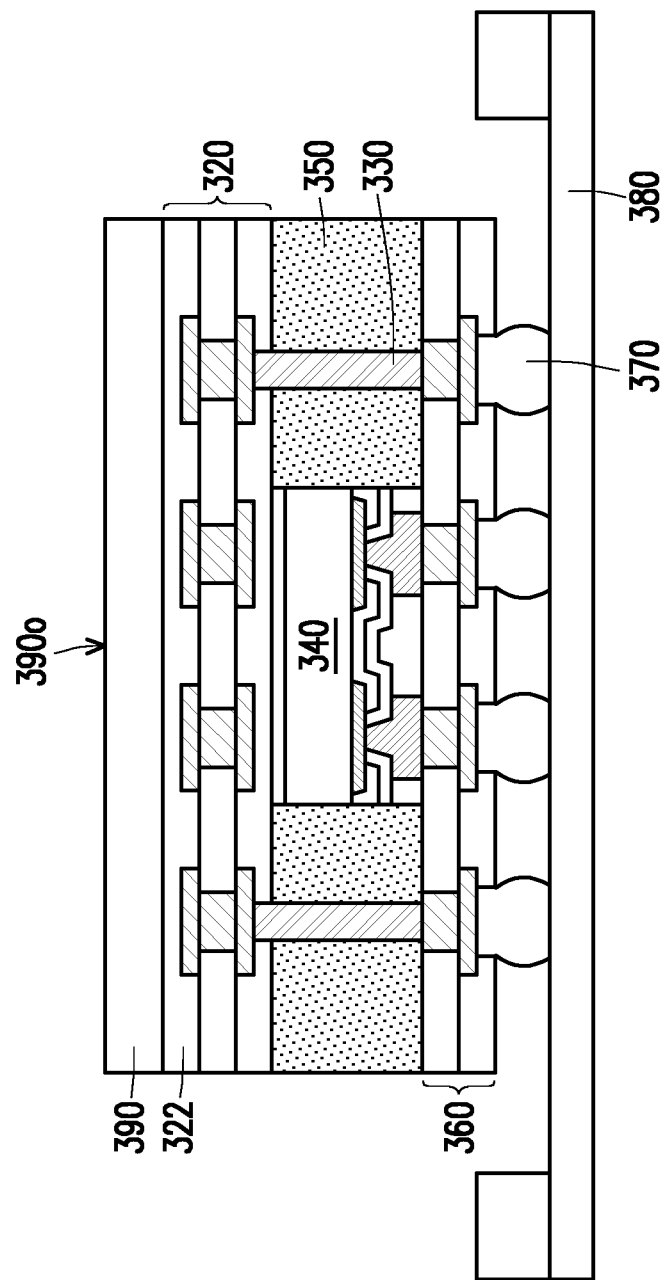

Referring to FIG. 4H and FIG. 4I, residuals of the de-bonding layer 310 may be removed, for example during a plasma-cleaning step, so that the outermost dielectric layer 322 of the redistribution structure 320 is exposed for further processing. In FIG. 4J, a back-side insulating layer 390 is laminated on the dielectric layer 322 of the redistribution structure 320. In some embodiments, the back-side insulating layer 390 is of shape and size equal the redistribution structure 320, so as to completely cover the redistribution structure 320. In some embodiments, the back-side insulating layer 390 includes a polymeric dielectric material. For example, the back-side insulating layer 390 may include Ajinomoto build-up film, polyimide, epoxy resins, or the like. In some embodiments, the back-side insulating layer 390 includes Ajinomoto build-up film. In some embodiments, the back-side insulating layer 390 is laminated on the dielectric layer 322 by using the lamination chuck 100 of FIG. 1A, for example via similar process steps as previously described with reference to FIG. 3A to FIG. 3C. As such, the back-side insulating layer 390 may be formed with a smooth outer surface 390o. For example, indentation and irregularities of the back-side insulating layer 390 may be smaller than about 50 micrometers.

Figure 4K:
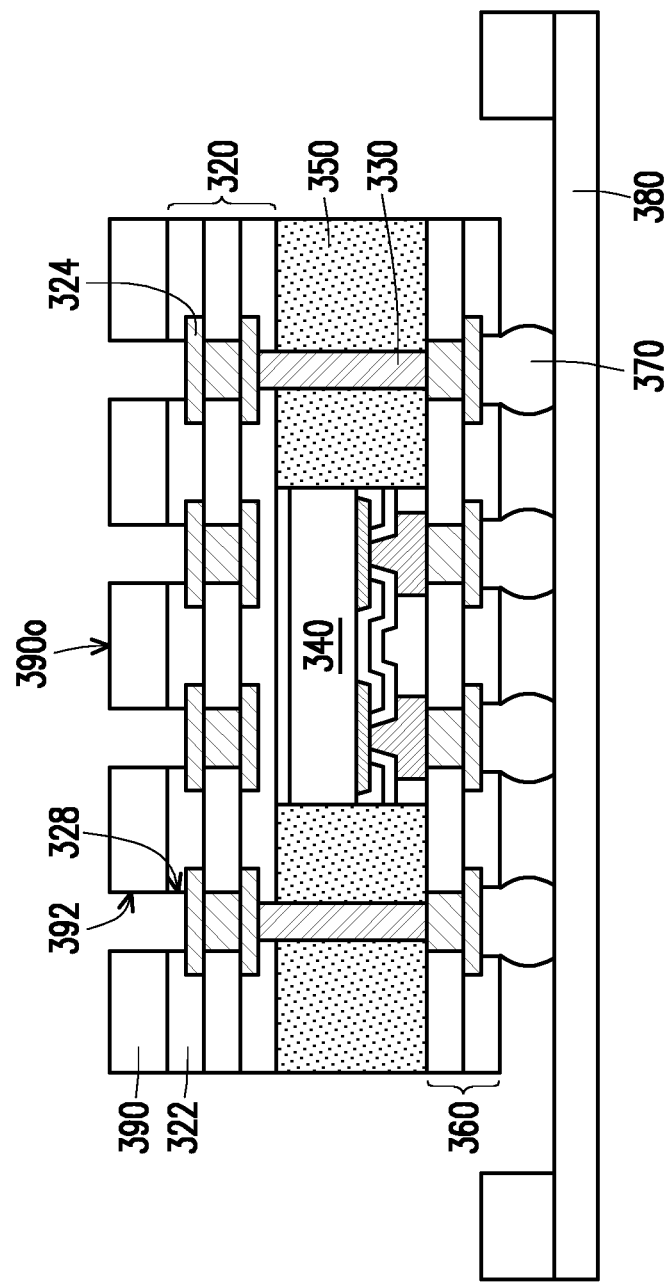

Referring to FIG. 4K, vertically aligned openings 392 and 328 are respectively formed in the back-side insulating layer 390 and the outermost dielectric layer 322, for example via laser drilling. The outermost redistribution conductive layer 324 of the redistribution structure 320 is thus exposed at the bottom of the openings 322. In some embodiments, because the back-side insulating layer 390 has been laminated by using a lamination chuck 100 such as the one of FIG. 1A, the outer surface 390o on which the laser light impinges to form the openings 392 may be substantially flat, so that openings 392 of neater shape may be formed. In some embodiments, the critical dimensions for shapes and sizes of the laser drill process may be improved as a consequence of the enhanced flatness of the outer surface 390o. For example, size of indentations and/or irregularities at the outer surface 390o may be smaller than 50 micrometers. After formation of the openings 392, 328, a cleaning step may be performed to remove residuals of the ablated dielectric materials.

Figure 4L:
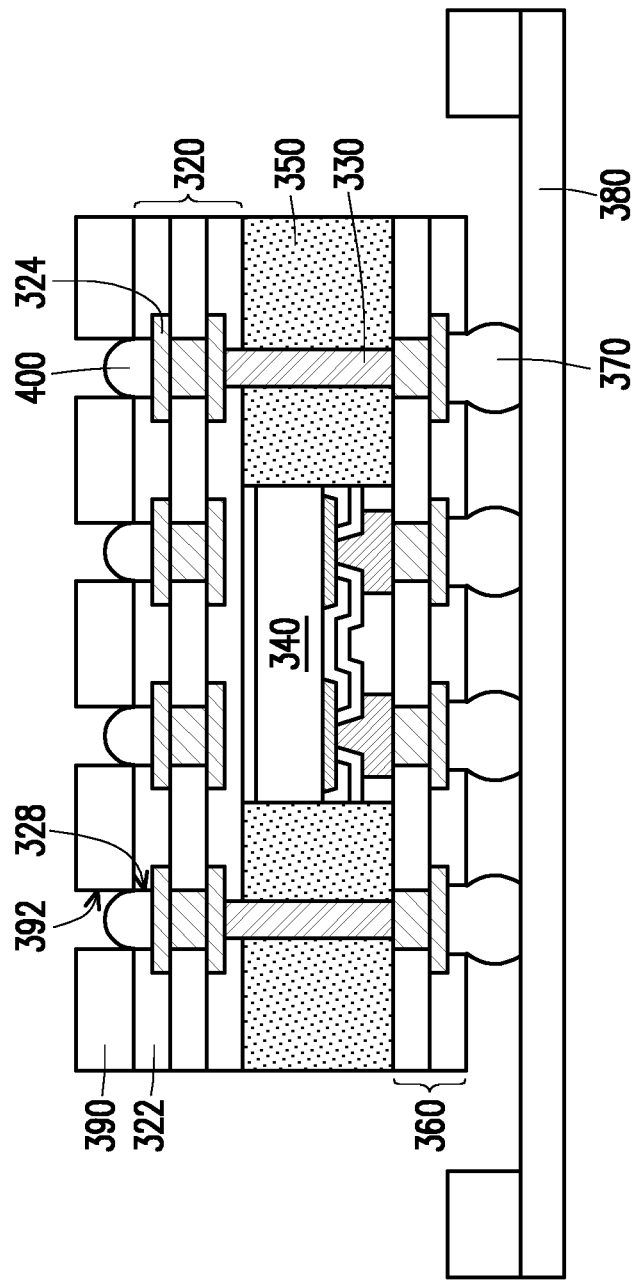
Figure 4M:
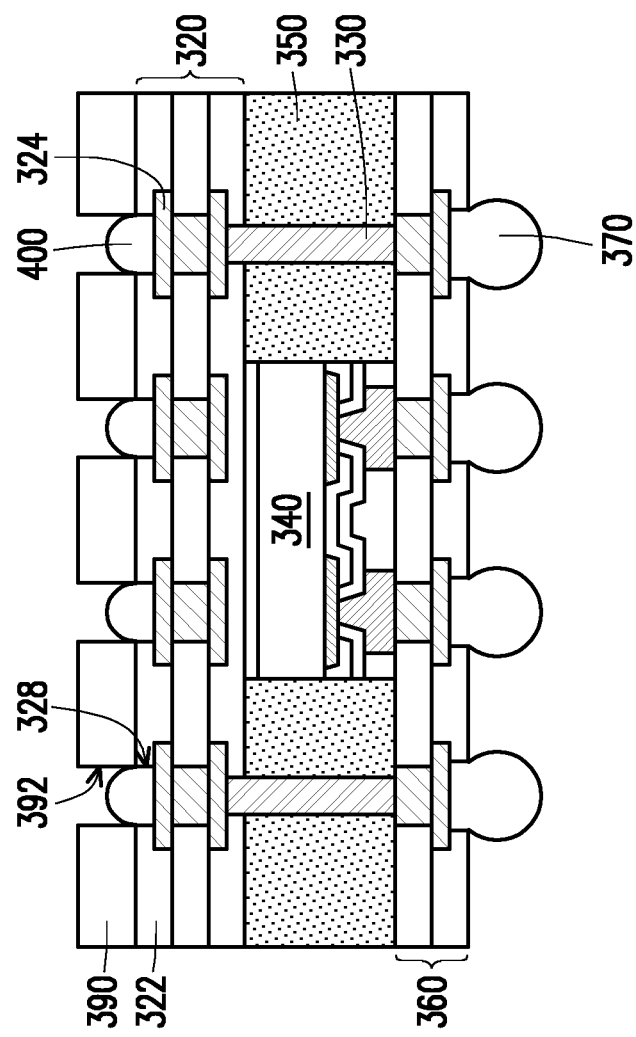

In FIG. 4L, connectors 400 are formed at the bottom of the openings 328 to contact the redistribution conductive layer 324. For example, solder material may be disposed at the bottom of the openings 328 on the exposed portions of the redistribution conductive layer 324, and a reflux step may be performed to form the connectors 400. In some embodiments, the solder material of the connectors 400 includes eutectic solder containing lead or lead-free. In some embodiments, the solder material of the connectors 400 includes non-eutectic solder. In some embodiments, the solder material of the connectors 400 contains Sn, SnAg, SnPb, SnAgCu, SnAgZn, SnZn, SnBiIn, SnIn, SnAu, SnCu, SnZnIn, SnAgSb, or similar soldering alloys. In some embodiments, the solder material is applied as a solder paste. A cleaning step (e.g., to remove residuals of soldering flux) may be optionally performed. When the manufacturing process is performed at a reconstructed wafer level, the semiconductor packages SP10 illustrated in FIG. 4M may be obtained following a singulation step, for example via mechanical or laser saw, removal from the frame 380, and cleaning.

Figure 5A:
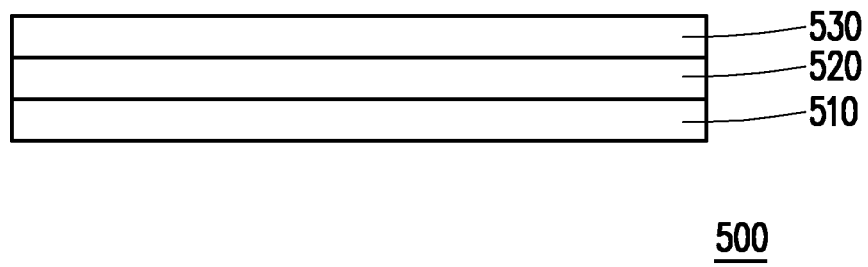
FIG. 5A to FIG. 5L are schematic cross-sectional views of structures formed during a lamination process according to some embodiments of the disclosure.

In the following, some aspects of the lamination of the back-side insulating layer 390 of FIG. 4J according to some embodiments will be briefly described with reference to FIG. 5A to FIG. 5L. In FIG. 5A, is illustrated a film material 500 to be laminated as the back-side insulating layer 390 of FIG. 4J according to some embodiments of the disclosure. In some embodiments, the film material 500 may be any suitable dielectric material which may be formed as a film, such as organic polymeric materials or the like. For example, the film material 500 may include Ajinomoto build-up film, polyimide, epoxy resins, or the like. In some embodiments, the film material 500 includes Ajinomoto build-up film. In some embodiments, a lamination film 520 (e.g., Ajinomoto build-up film) is disposed between a cover film 510 and a support film 530. Materials of the cover film 510 and the supporting film 530 are not particularly limited, and may include organic polymers such as PET or the like.

Figure 5B:
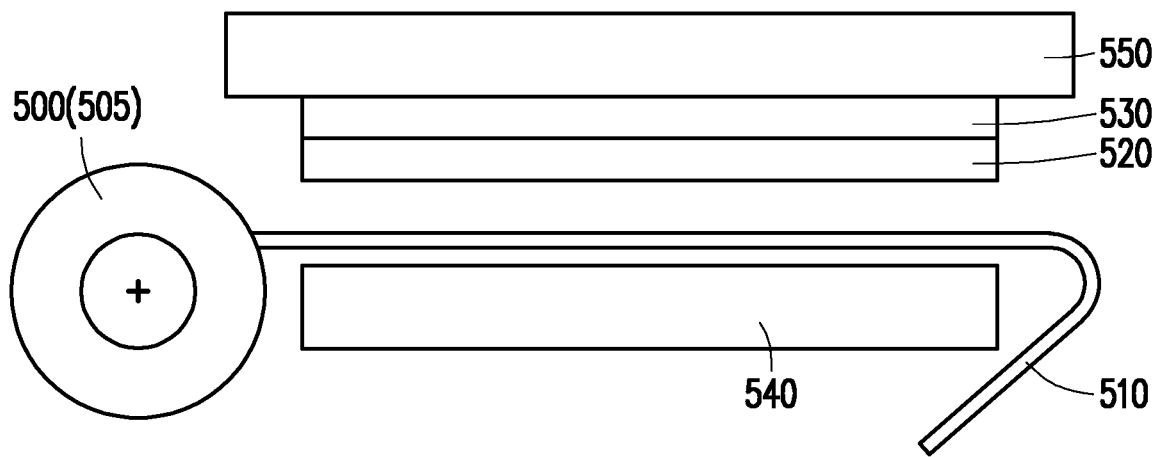
Figure 5C:
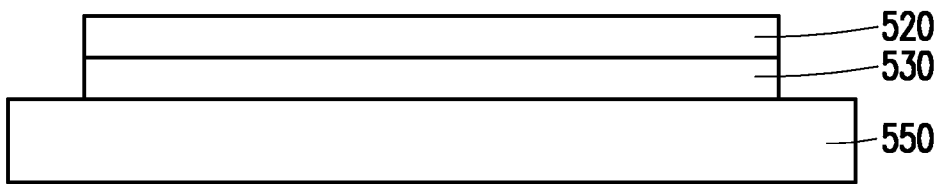

As illustrated in FIG. 5B, in some embodiments the film material 500 may be provided as a roll 505. In some embodiments, the film material 500 may be unrolled and pre-cut on a cutting table 540 before being disposed on a transport table 550. In some embodiments, the film material 500 is pre-cut according to the size and shape of the lamination substrate on which the lamination film 520 is to be laminated. Referring to FIG. 5B and FIG. 5C, in some embodiments, the cover film 510 may be removed during the pre-cutting step, and the lamination film 520 may be disposed on the transport table 550 with the support film 530 contacting the transport table 550. That is, the support film 530 may be interposed between the lamination film 520 and the transport table 550. After cutting, the transport table 550 may be flipped with respect to the cutting position.

Figure 5D:
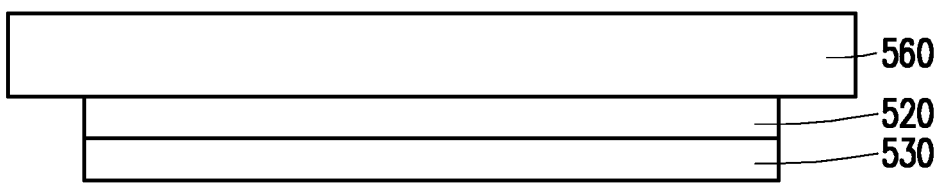
Figure 5D:
Figure 5E:
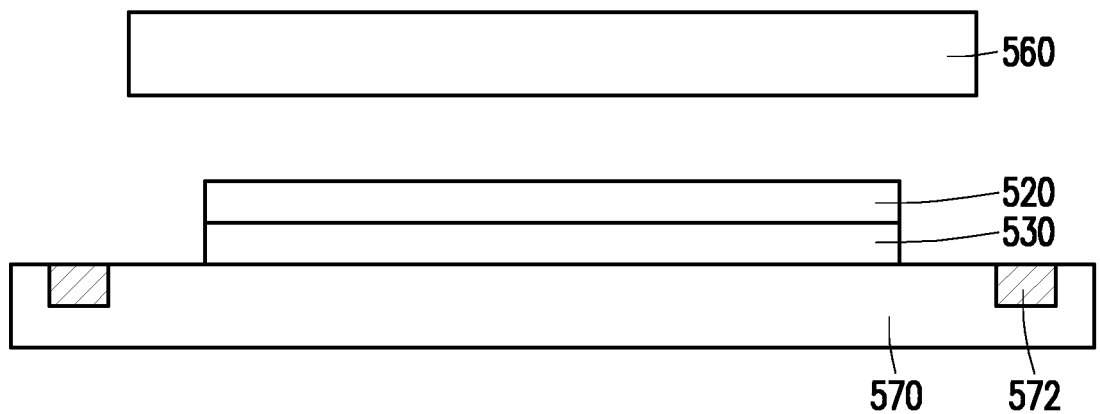

Referring to FIG. 5C and FIG. 5D, the transport table 550 with the lamination film 520 thereon is brought to face a transfer table 560, to which the lamination film 520 and the support film 530 are transferred. When on the transfer table 560, the lamination film 520 is disposed between the support film 530 and the transfer table 560, contacting the transfer table 560. In FIG. 5E, the lamination film 520 is then transferred from the transfer table 560 to the alignment table 570. The alignment table 570 may include one or more alignment marks 572 formed thereon, which may be recognized, for example by an optical sensor, so that the lamination film 520 and the support film 530 are disposed on the alignment table 570 in a position which results in pre-alignment of the lamination film 520 with respect to the lamination substrate. On the alignment table 570, the support film 530 may be interposed between the lamination film 520 and the alignment table 570.

Figure 5F:
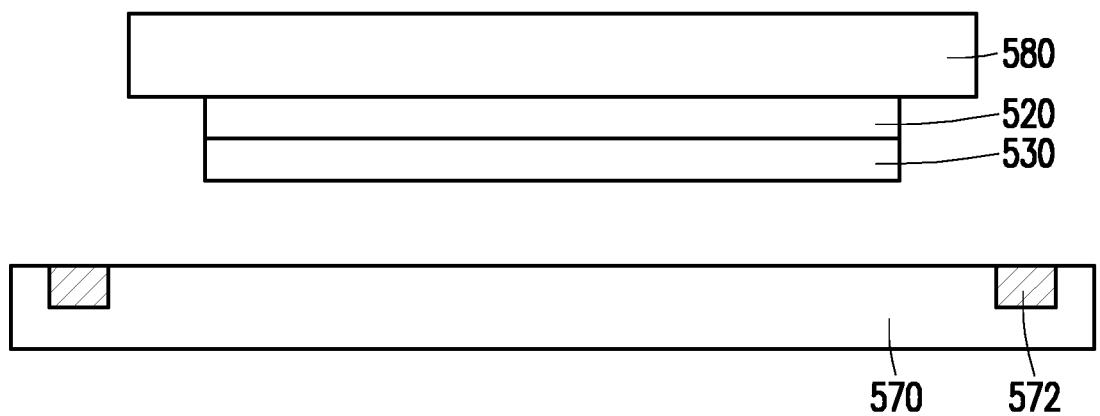
Figure 5G:
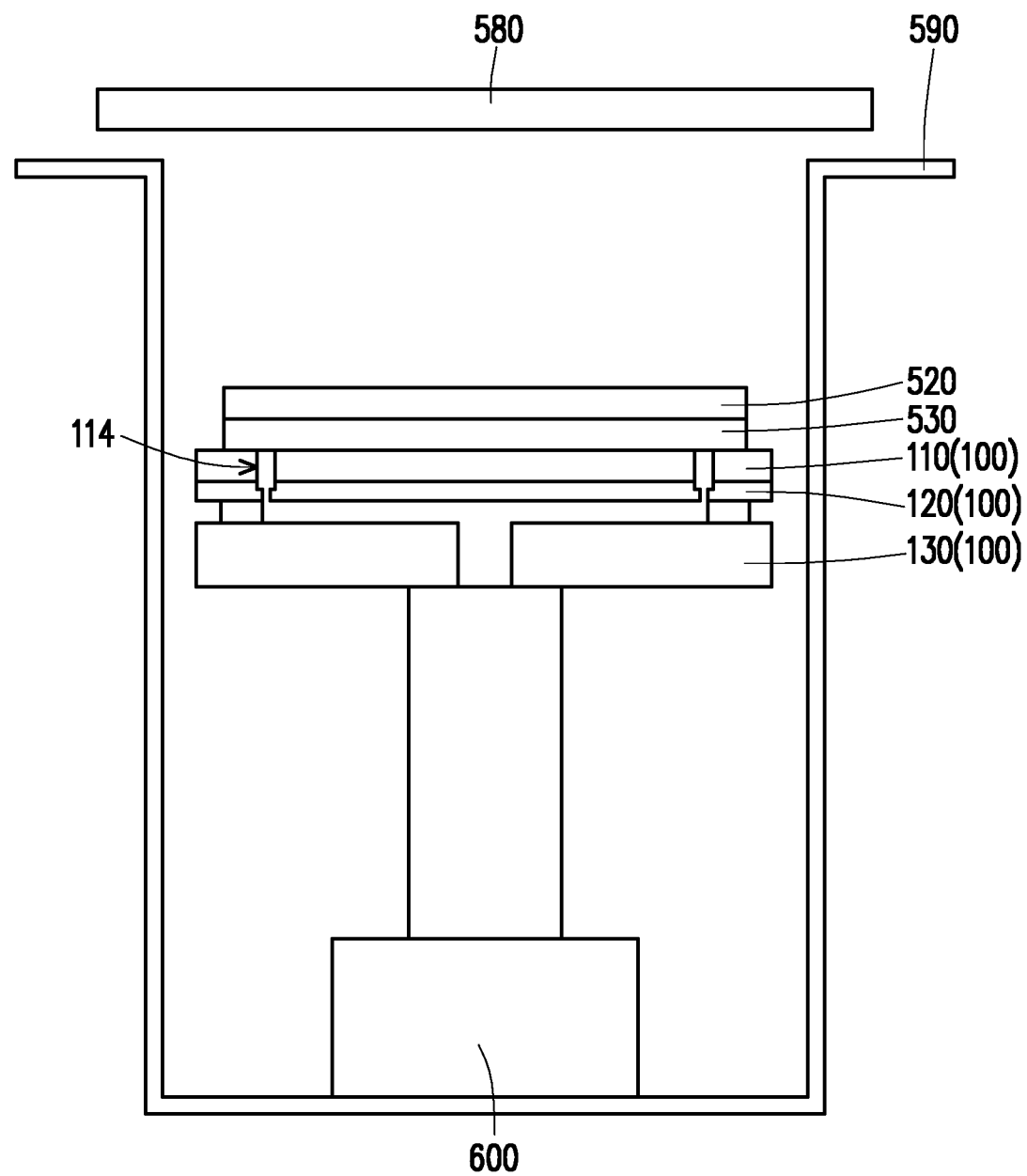

Referring to FIG. 5F and FIG. 5G, in some embodiments the lamination film 520 is transferred from the alignment table 570 to top layer 110 of the lamination chuck 100, for example via a transfer table 580 which may be part of an intermediary robot (not shown). On the transfer table 580, the lamination film 520 is disposed between the support film 530 and the transfer table 580, while on the lamination chuck 100 the support film 530 is disposed in contact with the top layer 110, in between the top layer 110 and the lamination film 520. The support film 530 with the lamination film 520 thereon are disposed on the lamination chuck 100 so as to cover the vacuum channel(s) 114 of the top layer 110. In some embodiments, the lamination chuck 100 is located in a lamination chamber 590, for example connected to a servo motor 600 capable of vertically displacing the lamination chuck 100. For example, the lamination chuck 100 may be connected to the servo motor 600 via connecting structures (not shown) formed on the base 130.

Figure 5H:
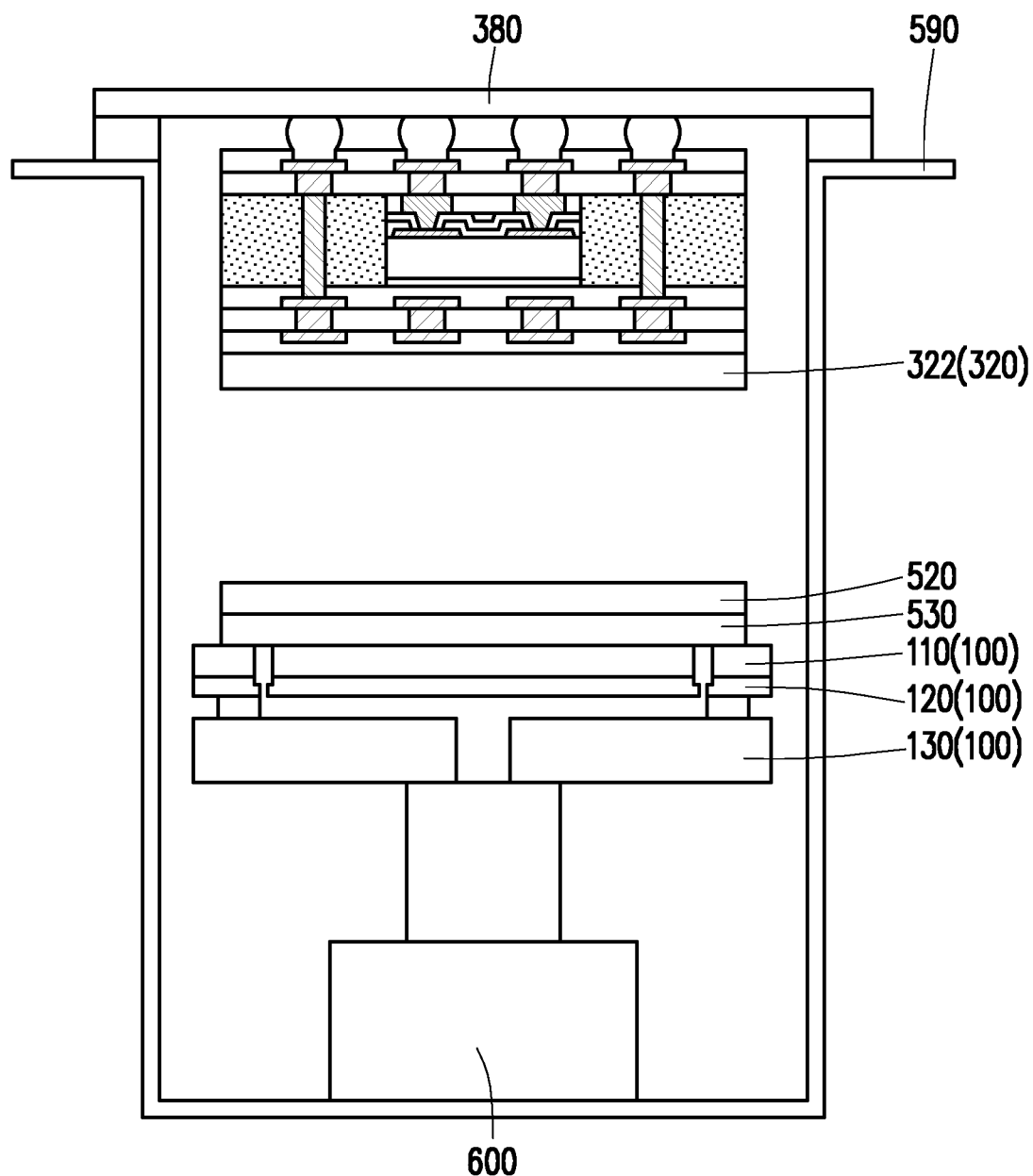
Figure 5I:
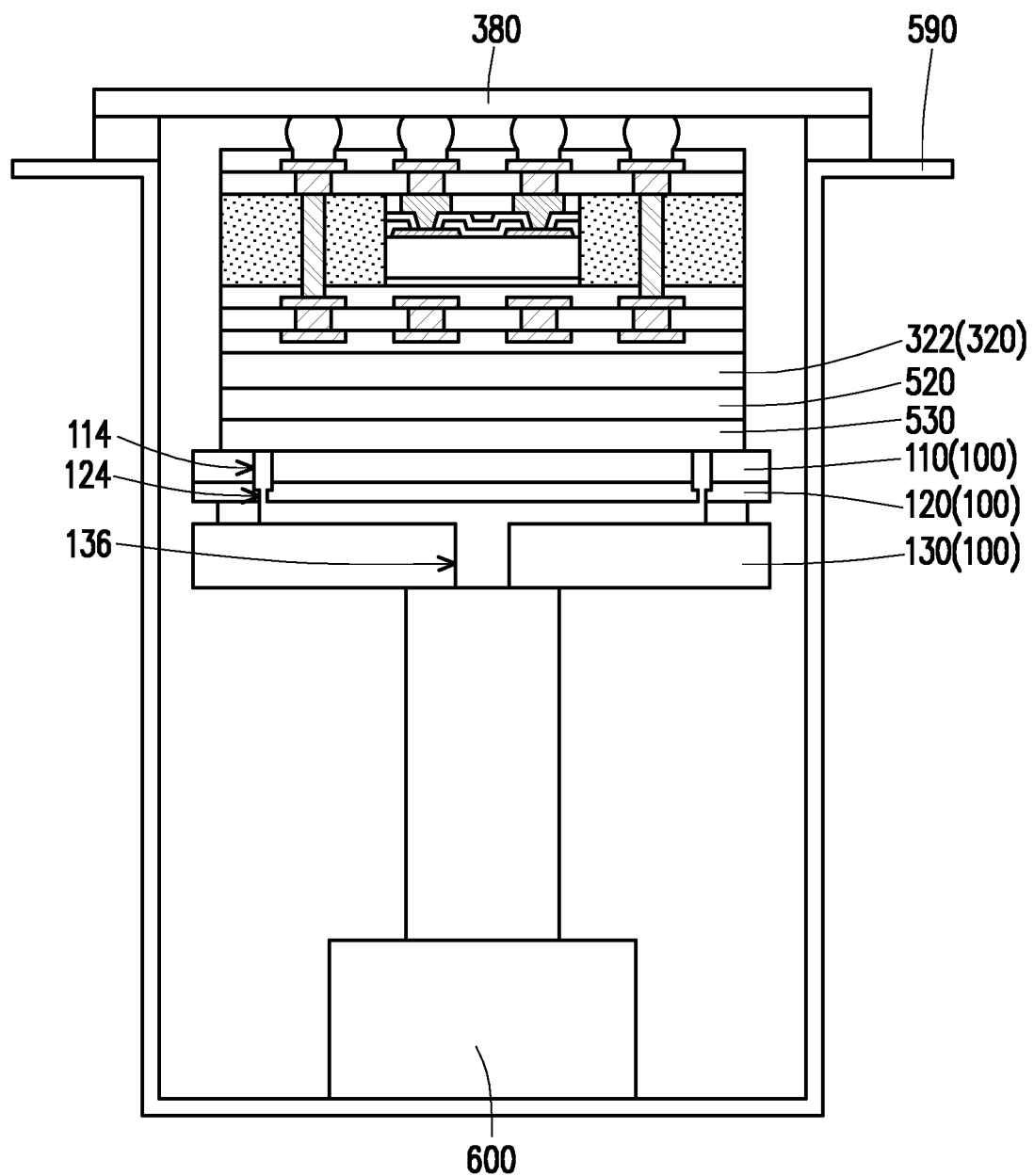

Referring to FIG. 5G and FIG. 5H, after the lamination film 520 is disposed on the lamination chuck 100, the lamination chuck 100 may be transported towards the bottom of the lamination chamber 590, for example by action of the servo motor 600. Then, the frame 380 with the structure of FIG. 4I formed thereon may be disposed on the lamination chamber 590, with the outermost dielectric layer 322 of the redistribution structure 320 directed towards the lamination film 520. That is, the outermost dielectric layer 322 may be the lamination substrate on which the lamination film 520 is subsequently laminated. Referring to FIG. 5I, suction may then be applied to the through hole 136 of the lamination chuck 100. The suction may be transmitted through the vacuum channels 124, 114 to the support film 530, whereby the lamination film 520 and the support film 530 are well tensed on the top layer 110 of the lamination chuck 100, as previously described with reference to FIG. 3B. The vacuum pump (not shown) to apply the suction may be integrated or be a separate piece with respect to the servo motor 600. In some embodiments, the applied suction may be such to generate a pressure differential with respect to atmospheric pressure of about 60 kPa to 80 kPa within the lamination chamber 590. That is, the pressure in the lamination chamber 590 may be 60 kPa to 80 kPa lower than the pressure outside the chamber. The lamination chuck 100 may then be brought towards the wafer on the frame 380, so that the lamination film 520 contacts the outermost dielectric layer 322. For example, the lamination chuck 100 may be lifted by action of the servo motor 600 until the lamination film 520 contacts the outermost dielectric layer 322. In some embodiments, by action of the servo motor 600, the lamination film 520 may be pressed against the outermost dielectric layer 322, for example with a pressure in the range from about 1 Kg/cm$^2$ to about Kg/cm$^2$. Depending on the materials to be laminated, the temperature may be about in the range from 70° C. to 130° C.

Figure 5J:
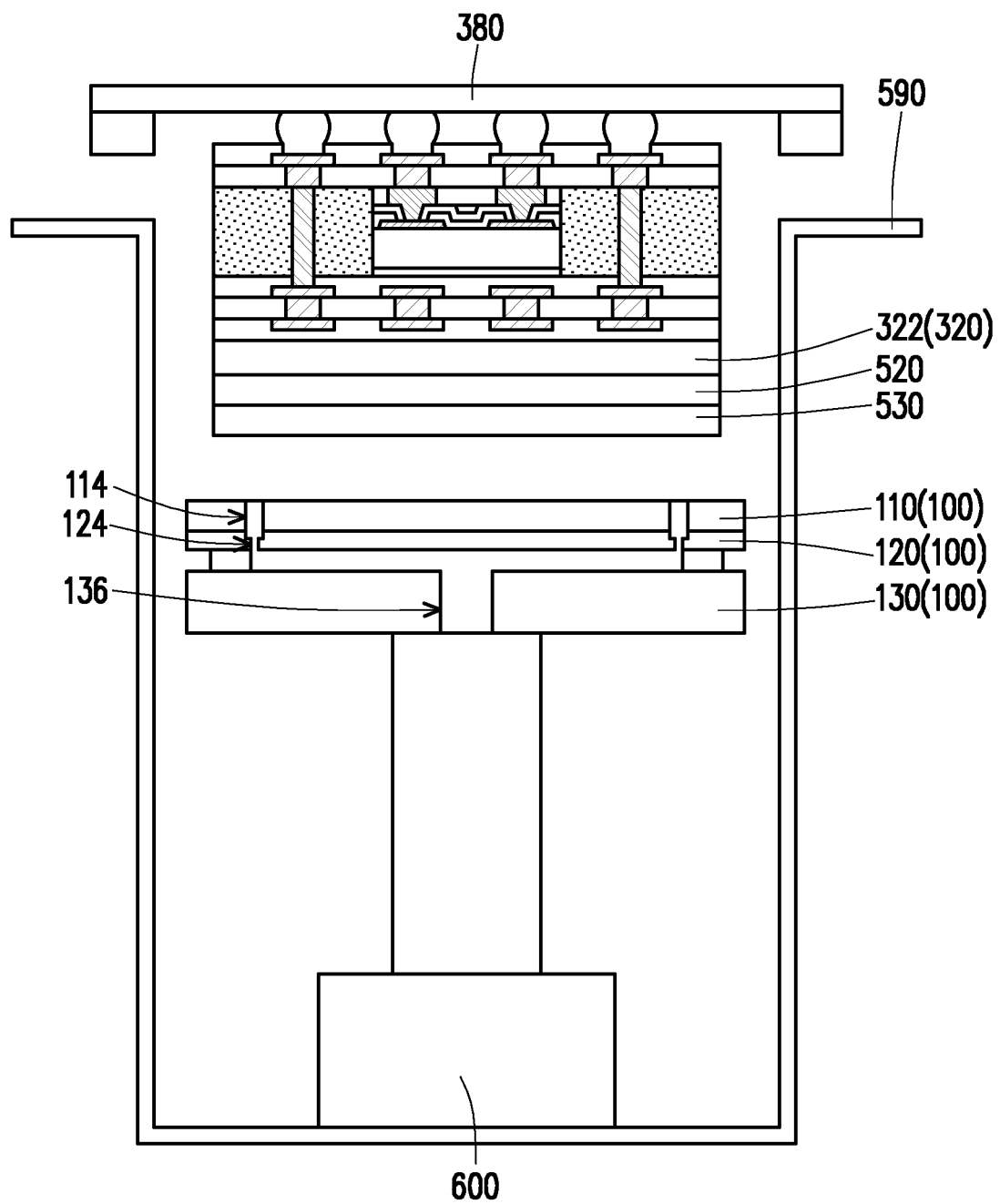
Figure 5K:
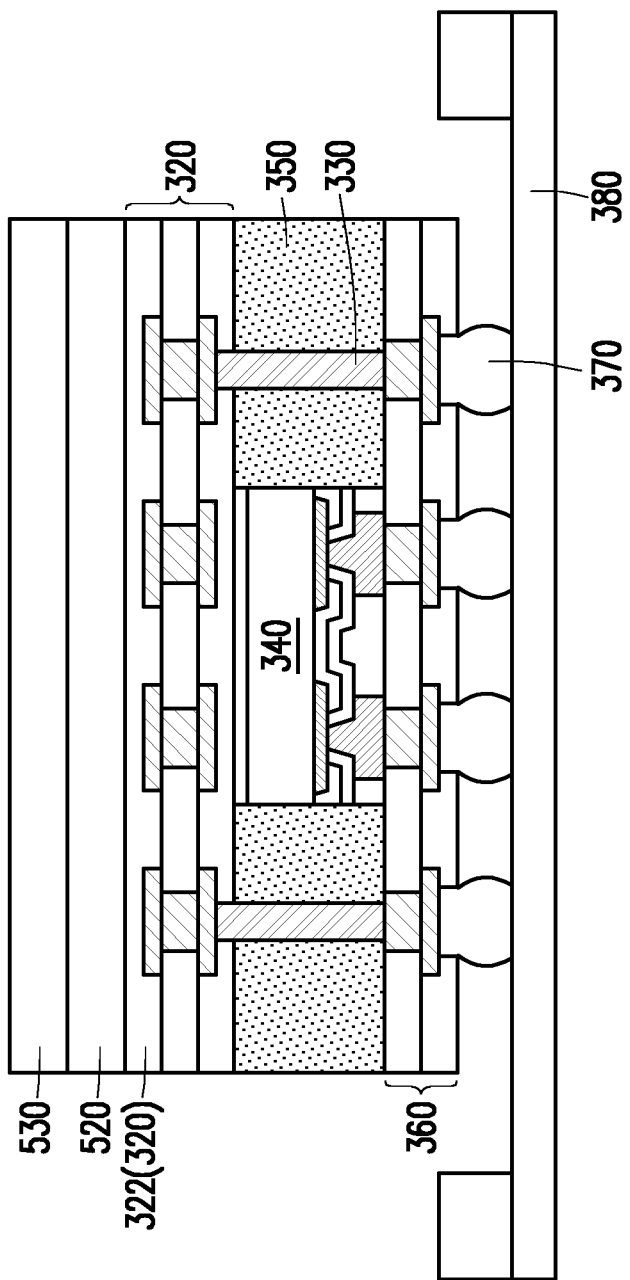
Figure 5L:
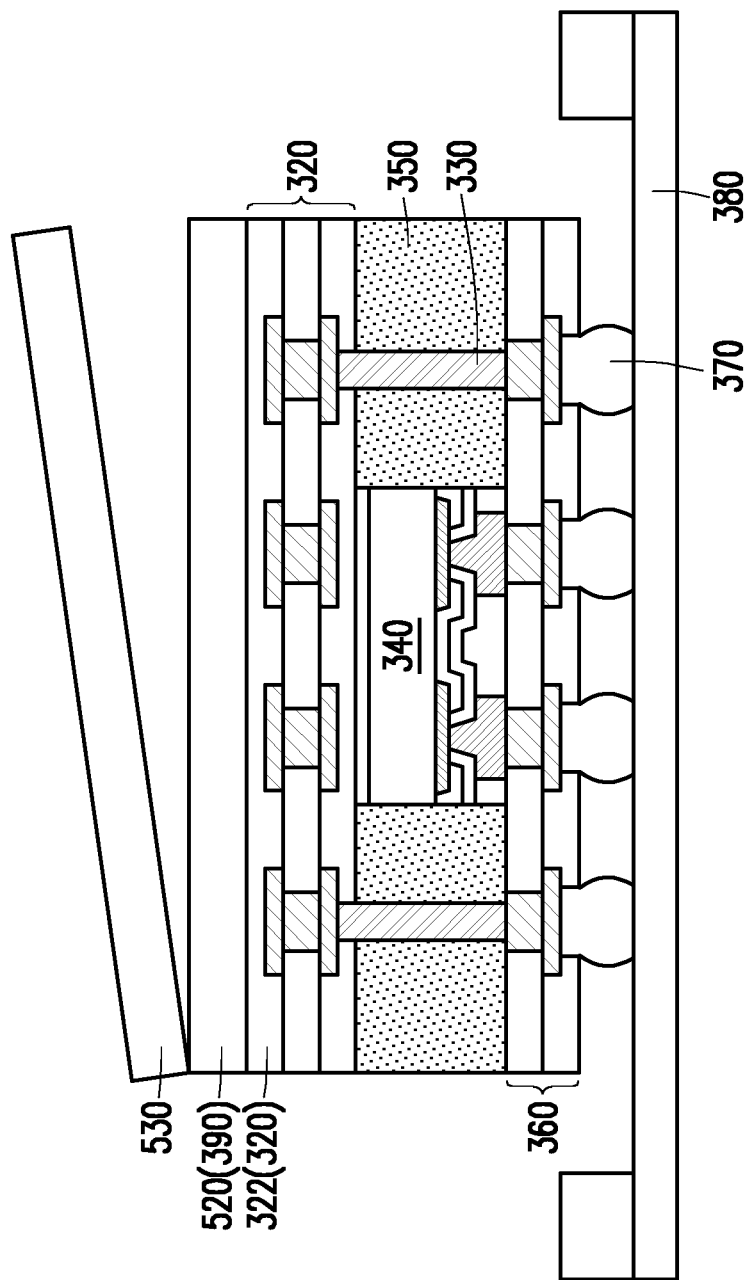

In FIG. 5J, after lamination, the frame 380 may be removed from the lamination chamber 590. Following lamination, the support film 530 may be detached from the lamination chuck 100, remaining attached to the lamination film 520 on the outermost dielectric layer 322. That is, as illustrated in FIG. 5K, the lamination film 520 and the support film 530 may be initially stacked on the outermost dielectric layer 322. Upon removal of the support film 530 (e.g., by peeling as illustrated in FIG. 5L), the structure of FIG. 4J may be obtained, with the lamination film 520 remaining on the outermost dielectric layer 322 to act as the back-side insulating layer 390.

In accordance with some embodiments of the disclosure, a lamination chuck for lamination of film materials includes a support layer and a top layer. The top layer is disposed on the support layer. The top layer includes a polymeric material having a Shore A hardness lower than a Shore hardness of a material of the support layer. The top layer and the support layer have at least one vacuum channel formed therethrough, vertically extending from a top surface of the top layer to a bottom surface of the support layer.

In accordance with some embodiments of the disclosure, a lamination method of a film material on a substrate includes the following steps. A film material is disposed on a chuck. The chuck includes a vacuum channel extending from a front surface of the chuck to a rear surface of the chuck. The chuck further includes a polymeric material disposed at the front surface of the chuck. The film material covers one end of the vacuum channel located at the front surface of the chuck. Suction is applied at an opposite end of the vacuum channel. The opposite end of the vacuum channel is located at the rear surface of the chuck, whereby the film material is tensed on the front surface of the chuck. The film material tensed on the chuck is contacted with the substrate. The chuck is separated from the substrate. The film material remains on the substrate after the chuck is separated from the substrate.

In accordance with some embodiments of the disclosure, a manufacturing method of a semiconductor package includes the following steps. A redistribution structure is formed. The redistribution structure includes a first dielectric layer. A dielectric film is laminated to the first dielectric layer. Laminating the dielectric film to the first dielectric layer includes the following steps. The dielectric film is disposed on a chuck. The chuck includes a channel extending therethrough. The dielectric film covers an end of the channel. The end of the channel is formed through a polymeric material of the chuck. Suction is applied at another end of the channel, so that the suction is transmitted to the dielectric film. The dielectric film disposed on the chuck is pressed against the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lamination method of a film material on a substrate, comprising:
   providing a chuck comprising a top layer with a polymeric material and a support layer supporting the top layer, wherein the chuck has vacuum channels arranged along an arc path concentric to a circumference of the top layer, each of the vacuum channels extends through the top layer and the support layer, and wherein the support layer comprises a through hole between the vacuum channels and an outer side edge of the support layer, the top layer comprises a hemicylindrical concavity located at an outer side edge of the top layer, the hemicylindrical concavity extends from a top surface of the top layer to a bottom surface of the top layer, and the hemicylindrical concavity aligns with the through hole of the support layer;
   disposing the film material on the top layer of the chuck to cover one end of the each of the vacuum channels;
   applying suction at an opposite end of the each of the vacuum channels, whereby the film material is tensed on a front surface of the chuck;
   contacting the film material tensed on the chuck with the substrate; and
   separating the chuck from the substrate, wherein the film material remains on the substrate after the chuck is separated from the substrate.

2. The lamination method of claim 1, wherein the chuck with the tensed film material thereon is pressed against the substrate with a pressure of 1 Kg/cm$^2$ to 5 Kg/cm$^2$.

3. The lamination method of claim 1, further comprising heating at a temperature in the range from 70 to 130° C. when the tensed film material disposed on the chuck contacts the substrate.

4. The lamination method of claim 1, wherein the suction is applied so that a pressure differential with respect to atmospheric pressure is in the range from 60 KPa to 80 KPa.

5. The lamination method of claim 1, wherein the polymeric material at the front surface of the chuck comprises at least one material selected from a rubber having a Shore A hardness of 20 to 50 and a powder free sponge material, and the film material is disposed on the polymeric material.

6. The lamination method of claim 5, wherein the chuck comprises:
   the top layer, comprising the polymeric material thermally bonded to the support layer, the support layer including a material having higher Shore hardness than the polymeric material of the top layer, and further comprises
   a base layer, to which the support layer and the top layer are fastened,
   wherein in a radial direction of the chuck, each of the vacuum channels has a first width in the top layer and a second width in the support layer, and the first width is different from the second width.

7. A manufacturing method of a semiconductor package, comprising:
   forming a redistribution structure, the redistribution structure comprising a first dielectric layer; and
   laminating a dielectric film to the first dielectric layer,
   wherein laminating the dielectric film to the first dielectric layer comprises:
   disposing the dielectric film on a chuck, wherein the chuck comprises a top layer and a support layer supporting the top layer and includes a channel extending therethrough, and the dielectric film covers an end of the channel, the end of the channel being formed through a polymeric material of the chuck, and wherein the support layer comprises a through hole between the channel and an outer side edge of the support layer, the top layer comprises a hemicylindrical concavity located at an outer side edge of the top layer, the hemicylindrical concavity extends from a top surface of the top layer to a bottom surface of the top layer, and the hemicylindrical concavity aligns with the through hole of the support layer;

applying suction at another end of the channel, whereby the suction is transmitted to the dielectric film and distributed along arc paths of an annular region formed by the channel; and pressing the dielectric film disposed on the chuck against the first dielectric layer.

8. The manufacturing method of claim 7, wherein disposing the dielectric film on the chuck comprises:

cutting the dielectric film and disposing the cut dielectric film on a first carrier;

transferring the cut dielectric film on an alignment table; and transferring the aligned dielectric film to the chuck.

9. The manufacturing method of claim 8, wherein the dielectric film is disposed on a supporting film, and the supporting film is disposed between the dielectric film and the chuck, in contact with the polymeric material of the chuck, so that the suction is exercised on the dielectric film through the supporting film.

10. The manufacturing method of claim 7, wherein the other end of the channel is located at a rear surface of the chuck, the channel is a branched channel, the end of the channel covered by the dielectric film is an end of one of plural branches of the channel formed through the polymeric material of the chuck, the plural branches of the channel have ends located at a front surface of the chuck along the arc paths of the annular region, and the dielectric film covers the ends of the plural branches of the channel located at the front surface of the chuck.

11. The manufacturing method of claim 7, further comprising providing a reconstructed wafer including semiconductor dies, an encapsulant encapsulating the semiconductor dies, and the redistribution structure formed on the encapsulated semiconductor dies.

12. The manufacturing method of claim 7, further comprising firing a laser towards the laminated dielectric film to form openings in the laminated dielectric film.

13. A lamination method of a film material on a substrate, comprising:

disposing the film material on a chuck having a soft surface, wherein the chuck includes vacuum channels arranged along a periphery of the soft surface along an arc path concentric to a circumference of the soft surface, and the film material covers the vacuum channels, and wherein the chuck comprises a top layer and a support layer supporting the top layer, the support layer comprises a through hole between the vacuum channels and an outer side edge of the support layer, the top layer comprises a hemicylindrical concavity located at an outer side edge of the top layer, the hemicylindrical concavity extends from a top surface of the top layer to a bottom surface of the top layer, and the hemicylindrical concavity aligns with the through hole of the support layer;

holding the film material on the chuck by a vacuum force provided in the vacuum channels;

contacting the film material with the substrate; and separating the chuck from the substrate, wherein the film material remains on the substrate after the chuck is separated from the substrate.

14. The lamination method of claim 13, wherein the chuck with the film material thereon is pressed against the substrate with a pressure of 1 Kg/cm$^2$ to 5 Kg/cm$^2$.

15. The lamination method of claim 13, further comprising heating at a temperature in the range from 70 to 130° C. when the film material disposed on the chuck contacts the substrate.

16. The lamination method of claim 13, wherein a suction is applied to the vacuum channels to generate the vacuum force by a pressure differential with respect to atmospheric pressure is in the range from 60 KPa to 80 KPa.

17. The lamination method of claim 13, wherein the soft surface comprises at least one material selected from a rubber having a Shore A hardness of 20 to 50 and a powder free sponge material, and the film material is disposed on the polymeric material.

18. The lamination method of claim 17, wherein the chuck comprises:

the top layer, comprising the polymeric material thermally bonded to the support layer, the support layer including a material having higher Shore hardness than the polymeric material of the top layer, and a base layer, to which the support layer and the top layer are fastened, wherein each of the vacuum channels extends from the top layer to the base layer.

19. The lamination method of claim 13, wherein disposing the film material on the chuck comprises:

forming the film material by disposing a lamination film on a supporting film;

cutting the film material and disposing the cut film material on a first carrier;

transferring the cut film material on an alignment table; and transferring the aligned film material to the chuck, wherein the supporting film is disposed between the lamination film and the chuck, in contact with the soft surface of the chuck.

20. The lamination method of claim 19, further removing the supporting film from the lamination film after separating the chuck from the substrate.

* * * * *